United States Patent
Lim et al.

(10) Patent No.: US 8,400,257 B2
(45) Date of Patent: Mar. 19, 2013

(54) VIA-LESS THIN FILM RESISTOR WITH A DIELECTRIC CAP

(75) Inventors: Ting Fang Lim, Singapore (SG); Chengyu Niu, The Colony, TX (US); Olivier Le Neel, Singapore (SG); Calvin Leung, Singapore (SG)

(73) Assignees: STMicroelectronics PTE Ltd, Singapore (SG); STMicroelectronics, Inc., Coppell, TX (US)

( * ) Notice: Subject to any disclaimer, the term of this patent is extended or adjusted under 35 U.S.C. 154(b) by 47 days.

(21) Appl. No.: 12/862,599

(22) Filed: Aug. 24, 2010

(65) Prior Publication Data

US 2012/0049997 A1    Mar. 1, 2012

(51) Int. Cl.
*H01C 1/012* (2006.01)

(52) U.S. Cl. .......................... 338/308; 438/384; 438/685

(58) Field of Classification Search ................... 438/384, 438/648, 685; 338/308
See application file for complete search history.

(56) References Cited

U.S. PATENT DOCUMENTS

| | | | |
|---|---|---|---|
| 3,289,046 A | 11/1966 | Carr | |
| 3,416,959 A | 12/1968 | Cormia | |
| 4,104,607 A | 8/1978 | Jones | 338/309 |
| 4,125,854 A | 11/1978 | McKenny et al. | |
| 4,392,992 A | 7/1983 | Paulson et al. | 252/512 |
| 4,746,896 A | 5/1988 | Mcquaid et al. | 338/314 |
| 4,752,814 A * | 6/1988 | Tuan | 257/60 |
| 4,766,411 A | 8/1988 | Prieto et al. | 338/306 |
| 5,037,766 A | 8/1991 | Wang | |
| 5,135,888 A | 8/1992 | Chan et al. | |
| 5,152,869 A | 10/1992 | Ferraris et al. | 156/652 |
| 5,468,672 A | 11/1995 | Rosvold | 437/60 |
| 5,485,138 A | 1/1996 | Morris | 338/306 |
| 5,494,845 A | 2/1996 | Sereda et al. | 437/60 |
| 5,503,878 A | 4/1996 | Suzuki et al. | |
| 5,623,097 A | 4/1997 | Horiguchi et al. | |
| 5,640,023 A | 6/1997 | Balasinski et al. | |
| 5,656,524 A | 8/1997 | Eklund et al. | 438/238 |
| 5,821,960 A | 10/1998 | Mitani | |
| 6,211,032 B1 | 4/2001 | Redford et al. | |
| 6,274,452 B1 | 8/2001 | Miura et al. | |
| 6,281,090 B1 * | 8/2001 | Kukanskis et al. | 438/382 |
| 6,426,268 B1 | 7/2002 | Huppert et al. | |
| 6,504,226 B1 | 1/2003 | Bryant | |
| 6,809,379 B2 | 10/2004 | Kreupl | |
| 6,890,810 B2 | 5/2005 | Amadon et al. | 438/210 |

(Continued)

FOREIGN PATENT DOCUMENTS

WO    2005/093868 A1    10/2005

OTHER PUBLICATIONS

Ng, H. et al., "Lateral Connection for a Via-Less Thin Film Resistor," U.S. Appl. No. 12/862,589, filed Aug. 24, 2010, 50 pages.

(Continued)

*Primary Examiner* — Kyung Lee
(74) *Attorney, Agent, or Firm* — Seed IP Law Group PLLC

(57) ABSTRACT

The present disclosure is directed to a thin film resistor structure that includes a resistive element electrically connecting first conductor layers of adjacent interconnect structures. The resistive element is covered by a dielectric cap layer that acts as a stabilizer and heat sink for the resistive element. Each interconnect includes a second conductor layer over the first conductive layer. The thin film resistor includes a chromium silicon resistive element covered by a silicon nitride cap layer.

22 Claims, 11 Drawing Sheets

U.S. PATENT DOCUMENTS

| | | | |
|---|---|---|---|
| 6,891,747 | B2 | 5/2005 | Bez et al. |
| 7,213,327 | B2 * | 5/2007 | Su et al. .................. 29/610.1 |
| 7,259,040 | B2 | 8/2007 | Pellizer et al. |
| 7,338,637 | B2 | 3/2008 | Pease et al. |
| 7,410,246 | B2 | 8/2008 | Bell et al. |
| 7,410,879 | B1 | 8/2008 | Hill et al. .................. 438/384 |
| 7,427,926 | B2 | 9/2008 | Sinclair et al. |
| 8,242,876 | B2 | 8/2012 | Le Neel et al. |
| 2003/0150101 | A1 | 8/2003 | Park et al. .................. 29/621 |
| 2005/0052498 | A1 | 3/2005 | Delametter et al. |
| 2006/0224753 | A1 | 10/2006 | Hama et al. |
| 2007/0189053 | A1 | 8/2007 | Pellizzer et al. |
| 2012/0085748 | A1 | 4/2012 | Le Neel et al. |
| 2012/0168754 | A1 | 7/2012 | Le Neel et al. |
| 2012/0170352 | A1 | 7/2012 | Le Neel et al. |

OTHER PUBLICATIONS

Le Neel, O. et al., "Multi-Layer Via-Less Thin Film Resistor," U.S. Appl. No. 12/862,594, filed Aug. 24, 2010, 48 pages.

Hui Chong Vince Ng et al., "Lateral Connection for a Via-Less Thin Film Resistor," U.S. Appl. No. 12/862,589, filed Aug. 24, 2010, 50 pages.

Olivier Le Neel et al., "Multi-Layer Via-Less Thin Film Resistor," U.S. Appl. No. 12/862,594, filed Aug. 24, 2010, 48 pages.

Olivier Le Neel et al., "Multi-Layer Via-Less Thin Film Resistor," Non-final Office Action mailed Jan. 30, 2012, for U.S. Appl. No. 12/862,594, 12 pages.

Colgan et al., "Phase formation in Cr-Si thin-film interactions," *Appl. Phys. Lett.* 37(10): 938-940, Nov. 15, 1980.

Extended European Search Report, dated Apr. 20, 2012, for European Application No. 11195500.1, 10 pages.

Galatsis et al., "p- and n-type Fe-doped $SnO_2$, gas sensors fabricated by the mechanochemical processing technique," *Sensors and Actuators B 93*: 562-565, 2003.

Hieber et al., "Structural and Electrical Properties of $CrSi_2$, Thin Film Resistors," *Thin Solid Films 36*: 357-360, 1976.

Hwang et al., "A novel structured polysilicon thin-film transistor that increases the on/off current ratio," *Semicond. Sci. Technol. 18*: 845-849, 2003.

Nishida et al., "A New Self-Aligned A-Si TFT Using Ion Doping and Chromium Silicide Formation," *Mat. Res. Soc. Symp. Proc. 219*: 303-308, 1991.

Nishida et al., "Semiconducting Properties of Pure and Mn-Doped Chromium Disilicides," *J. Phys. Chem. Solids. 39*: 499-505, 1978.

Privitera et al., "Morphological and electrical characterization of $Si_xCr_yC_zB_v$ thin films," *Microelectronic Engineering 87*: 430-433, 2010.

Sukhawuttichai et al., "Effect of $Bi_2O_3$ Addition on the Microstructure and Properties of the $SnO_2$ Varistor System," *33$^{rd}$ Congress on Science and Technology of Thailand*, Walailak University, Nakhon Si Thammarat, Thailand, Oct. 18-20, 2007, pp. 1-4.

Tuite, "Resistor Trimming," Retrieved Jan. 10, 2011 from http://electronicdesign.com/print/power/resistor-trimming17261.aspx, 2 pages, 2007.

Yamauchi et al., "Polysilicon Thin-Film Transistors with Channel Length and Width Comparable to or Smaller than the Grain Size of the Thin Film," *IEEE Transactions on Electron Devices 38*(1): 55-60, 1991.

* cited by examiner

VIA-LESS THIN FILM RESISTOR WITH A DIELECTRIC CAP

BACKGROUND

1. Technical Field

The present disclosure is directed to thin film resistors, and more particularly, to a thin film resistor having a dielectric cap, where the thin film resistor electrically connects conductive layers of adjacent interconnects.

2. Description of the Related Art

Precision resistors provide stable resistances for integrated circuits used in various precision electronic devices, such as pacemakers, printers, and testing or measuring instruments. Each electronic device utilizes specific resistance values and operates in different conditions. Manufacturers tailor precise resistance values for each electronic device by controlling the size of the resistor and by using materials having low temperature and voltage coefficients. However, the performance of these precision resistors is often impacted by variations in operating conditions, like temperature and voltage. Manufacturers strive to achieve tight tolerances with respect to resistance and size to better attain precise, stable resistances.

Conventional precision resistors include diffused resistors and laser trimmed polysilicon resistors. Diffused resistors have a dopant introduced into a polysilicon resistor layer in the substrate, forming a doped active region, such as a P-well or P-body in the substrate. High-ohmic polysilicon resistors have temperature coefficients of resistance in the range of 1,000 and 3,000 parts per million per degree Celsius with resistances in the range of 1 k and 10 k ohms/square. In addition, the resistance of a doped polysilicon layer changes with temperature because the carriers are activated, which can cause performance drifts that follow the operating temperature.

A length and width of the doped resistor layer, a depth of diffusion, and a resistivity of the dopant control the specific resistance achieved. Junction isolation techniques isolate the diffused resistor from other elements in the substrate. These isolation techniques, which take up precious space on the substrate, minimize the adverse impacts of space charge effects of p-n junctions that can alter the resistance as the operating voltage and frequency change. To compensate for these changes in resistance, manufacturers often include additional circuitry adjacent the resistor, thereby using more substrate area surrounding the resistor.

Laser trimming removes or cuts away portions of a polysilicon resistor layer to increase the resistance. More particularly, the laser alters the shape of the resistor to achieve a desired resistance value. As with diffused resistors, laser trimmed resistors use large areas of the substrate in order to achieve precise resistor values. The large area dimensions also allow these resistors to dissipate heat to the substrate. The size requirements of these resistors impact the density of devices in the integrated circuit. As a result of the continued miniaturization of integrated circuits, manufacturers strive to reduce the space requirements of precision resistors.

In addition to the horizontal space requirements, these precision resistors impact vertical space requirements of the associated electronic device. For example, FIG. 1 is a known electronic device 10 having a precision resistor 12 connected to an upper metal layer 14 through a plurality of vias 16 as disclosed in U.S. Pat. No. 7,410,879 to Hill et al. The electronic device includes a first metal layer 18 formed on a substrate 20. The precision resistor is formed on a first dielectric layer 22 that overlies the first metal layer 18 and the substrate 20. Prior to forming the vias 16, a resistor head contact structure 24 is formed over ends 26 of the precision resistor 12. The resistor head contact structure 24 includes a titanium tungsten layer 28 and a second dielectric layer 30.

A thin film resistor layer is generally evaporated or sputtered on the substrate 20 and then patterned and etched to form the resistor 12. In order to operate, the resistor requires an electrical connection to be made to the ends 26, which requires two mask layers, one to shape the resistor 12 and one to form the resistor head contact structures 24. These resistor head contact structures 24 protect the resistor during the via etch that will electrically connect upper metal layer 14 to the resistor 12.

A third dielectric layer 32 is formed overlying the precision resistor 12, the resistor head contact structure 24, and the first dielectric layer 22. The plurality of vias 16 are formed through the third dielectric layer 32 and filled with a conductive material to electrically connect the precision resistor 12 to the upper metal layer 14. Having the precision resistor 12 separated from the first metal layer 18 by the first dielectric layer 22 and having the precision resistor 12 separated from the upper metal layer 14 limits the manufacturer's ability to reduce the size of the electronic device. More particularly, having the first metal layer 18 and the resistor 12 separated by the first dielectric layer 22 adds significant vertical dimensions to the electronic device 10.

FIG. 2 is an isometric view of a known technique for forming precision resistors without vias connecting upper metal layers to the resistors. An electronic device 40 has a tantalum nitride resistor 42 formed directly on exposed portions of an aluminum layer 44 and on a planarized dielectric layer 46 as disclosed in U.S. Pat. No. 5,485,138 to Morris. The aluminum layer 44 is formed on a lower level dielectric layer 48 formed on a gallium-arsenide substrate 50.

The process of forming the resistor 42 includes depositing the aluminum layer 44 directly on the lower level dielectric layer 48 and then patterning and etching the aluminum to form metal lines. The dielectric layer 46 is then formed over the aluminum layer 44. A planarization step smoothes a top surface of the dielectric layer 46. Subsequently, an area of between 1 and 1,000 angstroms of the top of the aluminum layer 44 is exposed. A tantalum nitride layer is then deposited and etched to form the tantalum nitride resistor 42. As can be clearly seen in FIG. 2, the resistor 42 is significantly larger than the aluminum layer 44, which adds additional vertical dimensions to the electronic device 40.

Thin film resistors are attractive for high precision analog and mixed signal applications that have size constraints. Thin-film resistors are generally more precise than diffused and laser trimmed polysilicon resistors. Several parameters define performance of thin film resistors including the resistor's value, the resistor's tolerance, and the temperature coefficient of resistance. The temperature coefficient of resistance provides an adequate means to measure the performance of a resistor. Thin film resistors have superior temperature coefficient of resistance and voltage coefficients of resistance, i.e., a low thermal coefficient of resistance and a low voltage coefficient of resistance. Thin film resistors also have good resistor matching and stability under thermal stress for use in integrated circuits to implement a specific functionality, including biasing of active devices, serving as voltage dividers, and assisting in impedance matching, to name a few.

Many electronic devices utilize high precision thin film resistors, such as operational amplifiers, digital-to-analog converters with high accuracy, implanted medical devices, and radio frequency circuits with high accuracy. Radio frequency (RF) circuits utilize thin film resistors for input/output circuitry in both radio frequency complementary metal-oxide semiconductors (CMOS) and RF silicon germanium technology. In these high precision applications, thin film resistors with a high tolerance, good linearity, a low temperature coefficient of resistance, a high quality factor, and reliability in high current applications are desired. These precision resistors should have a sheet resistance between 100 and 2,000 ohms/square with a temperature coefficient of resistance between −100 and +100 parts per million per degree Celsius. However, integrating thin film resistors into existing product lines can be difficult due to the reduced size of many electronic devices.

BRIEF SUMMARY

The present disclosure describes a thin film resistor that laterally connects adjacent interconnect structures in an integrated circuit. Each interconnect structure includes a first conductor and a second conductor. A thin film resistor layer is formed over the interconnect structures and directly connects sidewalls of the first conductors to each other. The thin film resistor layer is also over the substrate extending between the interconnect structures. A portion of the thin film resistor layer is covered by a photoresist, leaving the remainder of the integrated circuit uncovered and exposed to an etch. After the etch, the photoresist is removed and the thin film resistor remains.

The thin film resistor may include a plurality of resistive layers, such as two chromium silicon layers, each between 50 and 500 angstroms in thickness. Alternatively, the thin film resistor may include multiple different resistive layers having different chemical compositions and different resistance values.

The thin film resistor may be covered by a dielectric cap, such as a silicon nitride layer between 400 and 600 angstroms in thickness. The dielectric cap provides the thin film resistor with good stability and temperature characteristics while protecting the thin film resistor layer from subsequent processing steps. The thin film resistor layer is very sensitive to damage from plasma etches, and if not protected such damage can impact the sheet resistance and temperature coefficient of resistance. The dielectric layer can act as a heat sink to dissipate heat away from the thin film resistor.

Laterally connecting adjacent interconnect structures through the first conductor eliminates the need for the processing steps of forming the resistor head contact structures and the vias that connect the resistor to the next metal level as described above with respect to the prior art. The thin film resistor provides thermally stable thin film resistors capable of achieving precise resistance values in a small area.

The interconnect structures may include a protective coating that prevents the etch from damaging the second conductor during removal of the excess thin film resistor layer. The protective coating reduces the concerns raised by misalignment of the photoresist because even if there is misalignment, the protective coating prevents the etch from damaging the interconnect structures. This allows for minimum spacing between interconnect structures to be achieved.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
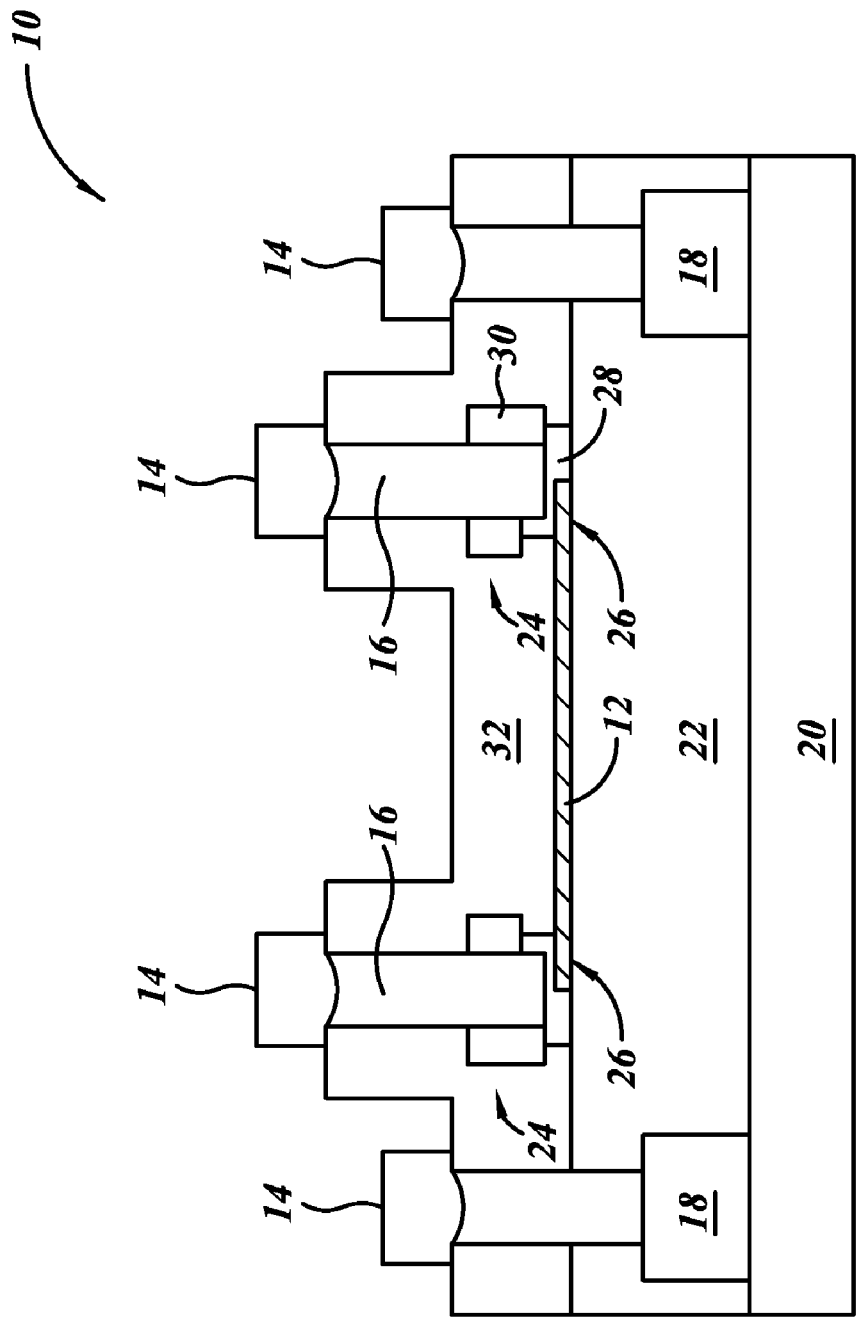
FIG. 1 is a side view of a known precision resistor having vias to connect metal layers taken through a semiconductor device.
Figure 2:
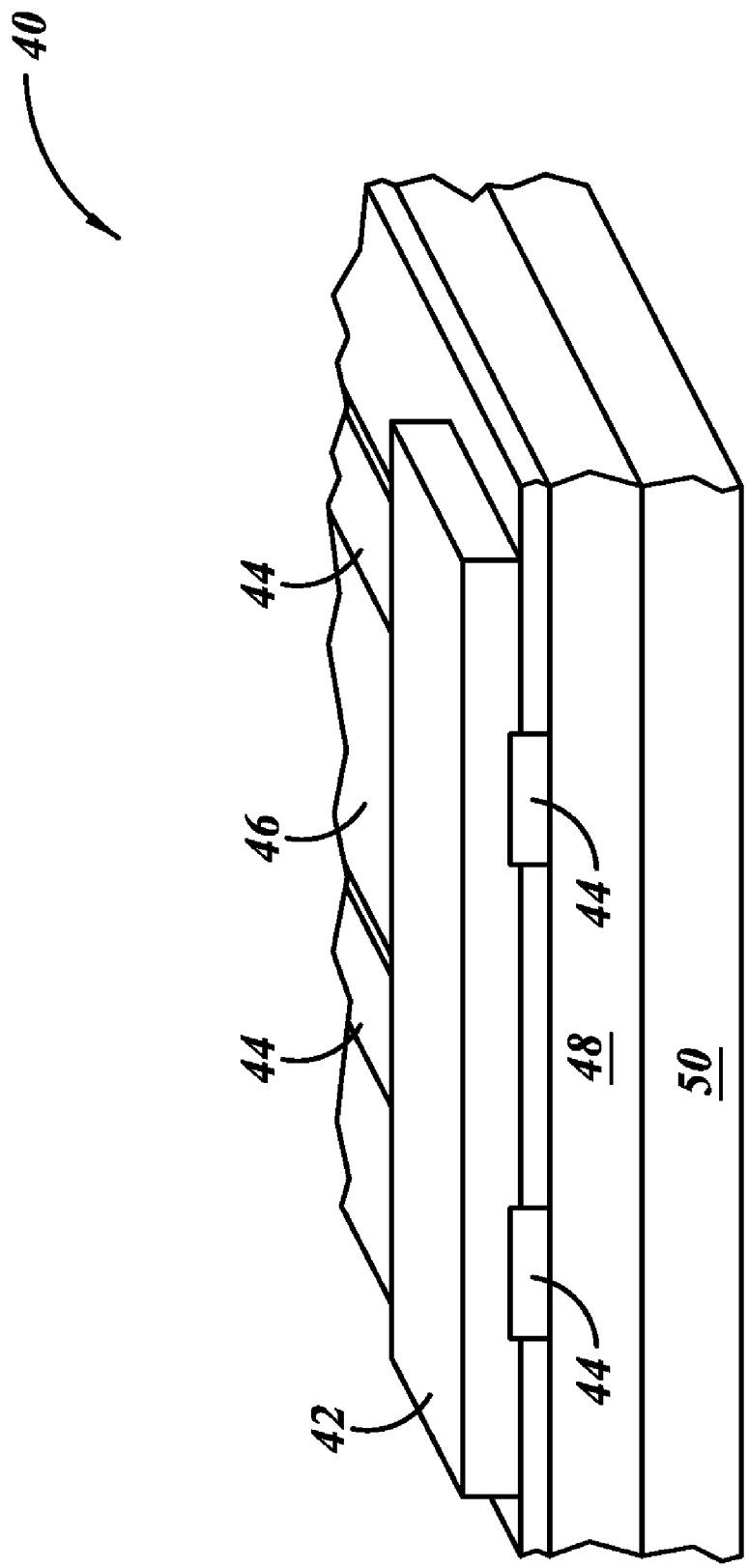
FIG. 2 is an isometric view of a known precision resistor directly contacting a top surface of an aluminum line over a semiconductor substrate.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Figure 3:
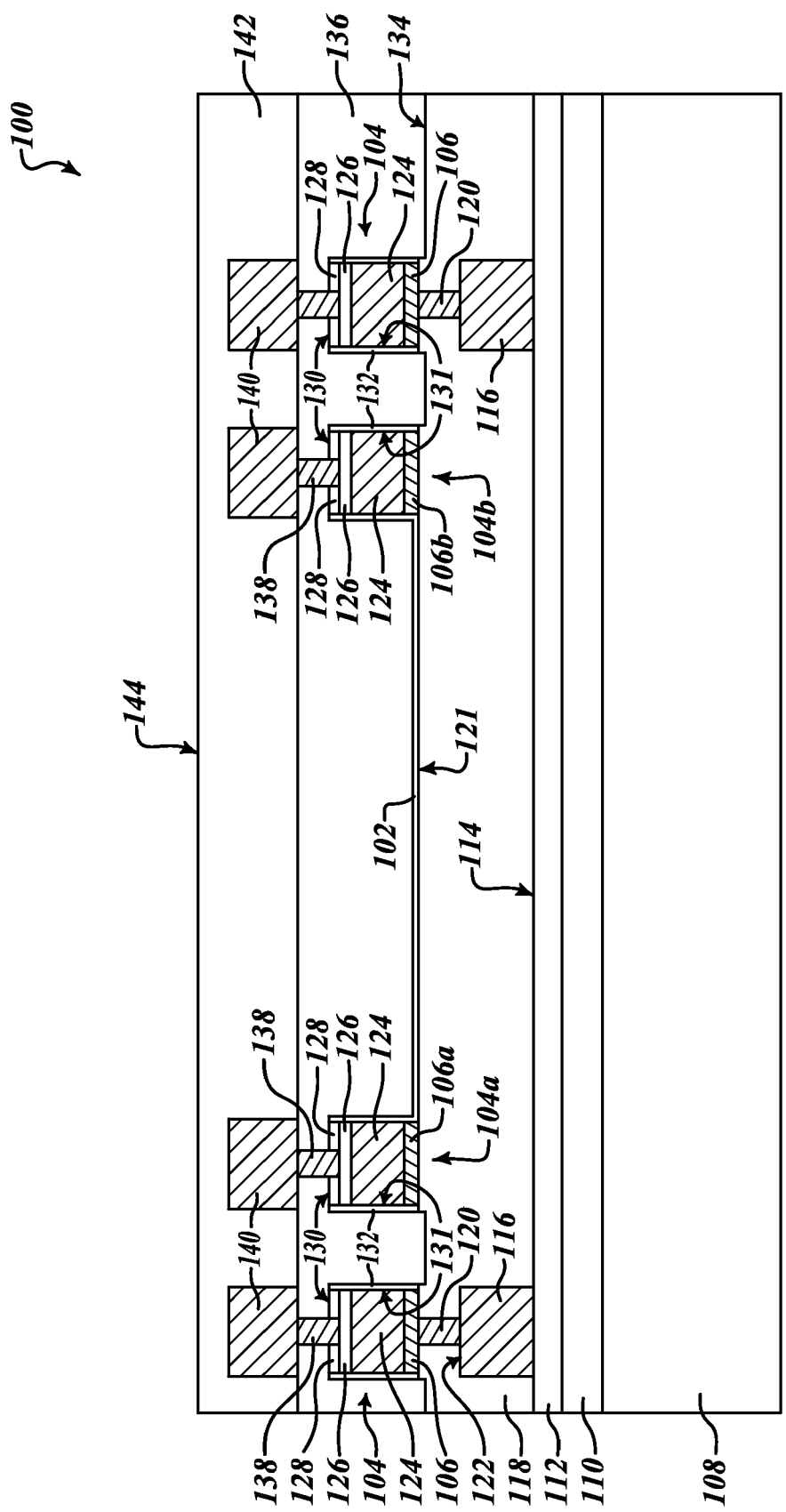
FIG. 3 is a cross-sectional view of an integrated circuit having a thin film resistor laterally connecting adjacent interconnect structures.

FIG. 3 is a cross-sectional view of a portion of an integrated circuit 100 having a thin film resistor 102 laterally connecting a first interconnect structure 104a and a second interconnect structure 104b of a plurality of interconnect structures 104. Each interconnect structure 104 includes a first conductive layer 106 and a second conductive layer 124. The thin film resistor 102 connects the first conductive layers 106a, 106b of the first and second interconnect structures 104a, 104b. The integrated circuit 100 includes a substrate 108 onto which a plurality of transistors, diodes, and other electronic devices (not shown in this cross-section) are formed in conjunction with the thin film resistor 102 to make the integrated circuit 100 operational. The substrate 108 may be monocrystalline silicon, gallium-arsenide, or an alternative material onto which integrated circuits are formed.

A first interlevel dielectric layer 110 is formed on the substrate 108 to be used as insulation between transistors and other active components formed at other locations in the integrated circuit 100. The first interlevel dielectric layer 110 may be a deposited layer of oxide or other insulating material. For example, the first interlevel dielectric may be a premetal dielectric layer (such as borophosphosilicate glass (BPSG)). A second interlevel dielectric 112 is formed over the first interlevel dielectric layer 110, which may be used to provide a top planar surface 114 after the transistors or other components are formed. The second interlevel dielectric may be an insulating material, such as tetraethyl orthosilicate (TEOS). The second interlevel dielectric 112 also isolates the transistors or other components from a plurality of first conductive structures 116. In one embodiment, the BPSG may be 6,000 angstroms thick and the TEOS may be 16,000 angstroms thick.

Formation of the first conductive structures 116 is well known in the art and will not be described in detail. A variety of metals or other conductive materials, such as aluminum, can be used to form the first conductive structures 116. A third interlevel dielectric 118 isolates the plurality of first conductive structures 116 from each other and other devices formed in or over the substrate 108. The third interlevel dielectric 118 may include a plurality of layers, such as multiple depositions of the same material or layers of different dielectric materials. The third interlevel dielectric 118 may be planarized after formation by a chemical mechanical polish or other techniques that remove irregularities from the surface of the integrated circuit 100.

A plurality of first conductive vias 120 are formed through the third interlevel dielectric 118 to expose a top surface 122 of the first conductive structures 116. The first conductive vias 120 can be formed of any conductive material, such as tungsten, copper, or aluminum, to provide an electrical connection to the plurality of first conductive structures 116. A barrier layer (not shown) may be formed as a protective barrier to line the first conductive vias 120 prior to forming the conductive material in the first conductive vias 120. For example, the barrier layer may be titanium tungsten or titanium nitride.

Figure 6:
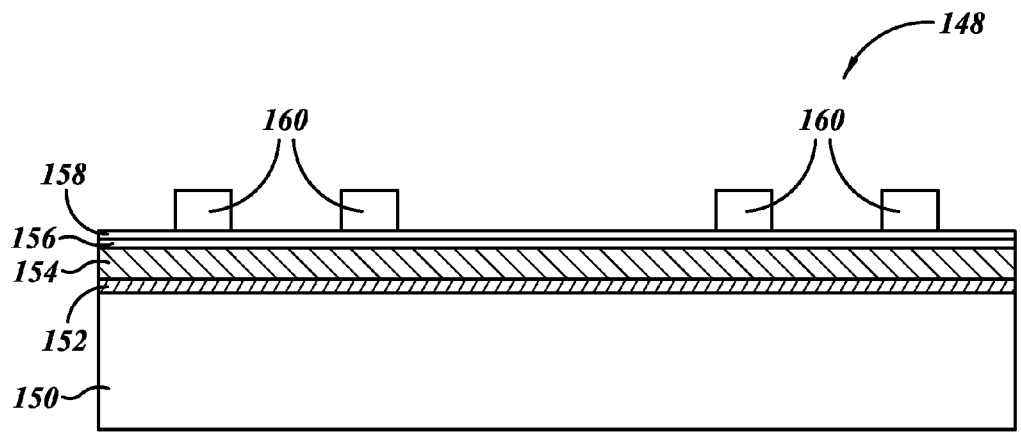
FIGS. 6-11 are cross-sectional views of various steps in the process to form an integrated circuit having interconnect structures and a thin film resistor.
Figure 7:
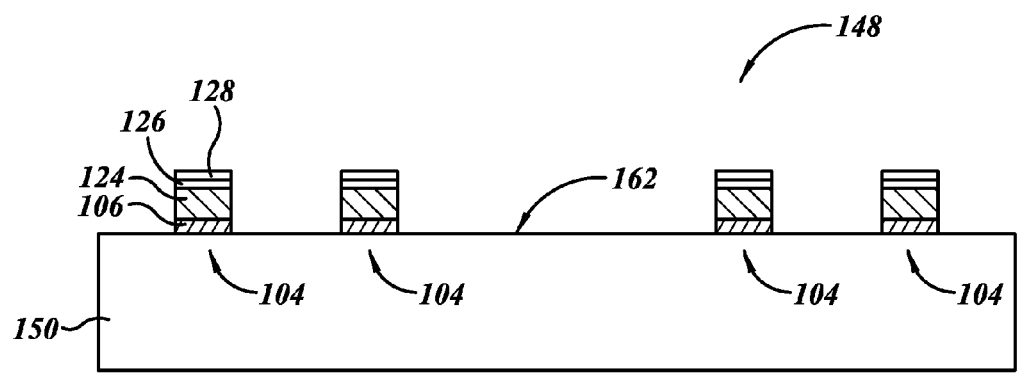

The plurality of interconnect structures 104, including the first and second interconnect structures 104a, 104b, are formed over the third interlevel dielectric 118. Methods of forming the plurality of interconnect structures 104 are described in more detail with respect to FIGS. 6-8. Each of the interconnect structures 104 have sidewalls 131 that are transverse to a top surface 121 of the third interlevel dielectric layer 118.

Each of the plurality of interconnect structures 104 includes a first conductor 106 formed over the third interlevel dielectric 118 and a second conductor 124 over the first conductor 106. An antireflective coating 126 overlies the second conductor 124. The antireflective coating 126 is optional and can be omitted. Each of the plurality of interconnect structures 104 have a protective coating 128, on the antireflective coating 126 or directly on the second conductor 124, that forms a top surface 130 of the interconnect structures 104.

The thin film resistor 102 is formed by deposition of a thin film resistor layer over the third interlevel dielectric 118 and the interconnect structures 104. Numerous resistive materials may be utilized to form the thin film resistor 102, including, but not limited to, metallic films like chromium silicon, nickel chromium, tantalum nitride, tantalum aluminum, and titanium nitride. These materials have better performance than conventional polysilicon resistors because they can form a wide range of sheet resistances, have good tolerance, are easily reproducible, and have low temperature coefficients of resistance, have linear behavior, and have low parasitic capacitance values. These resistive materials are generally formed by an evaporation technique, a sputter technique, or a chemical vapor deposition technique.

Precise resistance control of the thin film resistor permits high quality analog circuits such as analog-to-digital converters and digital-to-analog converters to be constructed. If careful selection is used in deciding the type of thin film resistor layer to use, a higher quality circuit can be constructed. The resistive value of the thin film resistor 102 is called the sheet resistance, which is a measure of resistance in thin films that have a uniform thickness. The sheet resistance of each thin film resistor depends on the length and width of the resistor, the material used to form the resistor, and the operating temperature of the associated integrated circuit or electronic device. The following formula is used to calculate sheet resistance, R, measured in ohms per square (ohms/square).

$$R = \rho L/wt$$

where $\rho$ is the bulk resistivity, L is the resistor length, w is the resistor width, and t is the resistor thickness.

The thin film resistor 102 has a controllable sheet resistance and a controllable temperature coefficient of resistance, which both depend on the composition of the material and the process conditions. In some products, a temperature coefficient of resistance of zero is desired. For example, chromium silicon films have been developed for use in precision integrated circuits, such as temperature sensors and current sensors. Chromium silicon achieves a high sheet resistivity in the range of 2,000 and 3,000 ohms/square, which results in a high resistance in a small area of the integrated circuit. Resistance of chromium silicon films depends on the percentage of silicon in the composition and can be easily tailored to meet the resistance specifications of a particular integrated circuit. Chromium silicon also exhibits a low temperature coefficient of resistance in the range of ±250 parts per million per degrees Celsius (ppm/C) and can reach a near-zero temperature coefficient of resistance with specialized processing.

The thin film resistor 102 may be formed to have a thickness of less than 100 angstroms. In other embodiments, the thin film resistor 102 may have a thickness in the range of 50 and 500 angstroms. With these small thicknesses, the thin film resistor 102 can be formed between adjacent interconnect structures 104 without negatively impacting the interlevel dielectric planarization of subsequent levels in the integrated circuit 100.

The first and second interconnect structures 104a, 104b are electrically connected to the thin film resistor 102 through the first conductors 106a and 106b. This eliminates the need to form vias to connect a thin film resistor to the next metal or conductive layer as in FIG. 1. Instead, the first conductors 106a, 106b allow the thin film resistor 102 to be formed on the same level of the integrated circuit 100 as the first and second interconnect structures 104a, 104b. This significantly reduces manufacturing time and costs by reducing the processing steps and reducing the amount of materials used to complete the integrated circuit 100. Also, the overall vertical and horizontal dimensions of the integrated circuit are decreased.

In FIG. 3, vertical portions 132 of the thin film resistor layer remain on sidewalls of the interconnect structures 104. In some other embodiments, the vertical portions 132 of the thin film resistor layer do not remain in the final product. Their existence depends on how the manufacturer decides to pattern and form the thin film resistor 102 and how to expose the top surface 130 of the interconnect structures 104. If the vertical portions 132 of the thin film resistor layer are left intact, these vertical portions 132 protect the interconnect structure from under etch when the thin film resistor 102 is defined and portions of the third interlevel dielectric 118 are reexposed. Alternative structures will be described in more detail below, with respect to FIGS. 6-20.

The thin film resistor layer on the top surface 130 of the interconnect structures 104 is partially or fully removed when defining the thin film resistor 102. The protective coating 128 prevents the etch chemistry from damaging the second conductors 124 and the antireflective coating 126 during the removal of the thin film resistor layer from the top surfaces 130 of the interconnect structures 104. Some of the protective coating 128 may be removed during the etch; however, the protective coating 128 prevents damage to the second conductors 124 during removal of the excess thin film resistor layer.

In some embodiments, a surface 134 of the third interlevel dielectric 118 is exposed when the thin film resistor 102 is patterned from the thin film resistor layer. As shown in FIG. 3, an etch to remove the thin film resistor layer may over etch and remove some amount of the exposed third interlevel dielectric 118 to form the surface 134. The over etch may occur to ensure the excess portions of the thin film resistor layer are removed, thereby avoiding shorting adjacent interconnect structures 104 that are not intended to be electrically connected.

A fourth interlevel dielectric 136 is formed over the top surfaces 130 of the interconnect structures 104, the thin film resistor 102, and the surface 134 of the third interlevel dielectric 118. A plurality of second conductive vias 138 extend through the fourth interlevel dielectric 136 and the protective coating 128 to expose the antireflective coating 126 or the second conductor 124. As with the plurality of first conductive vias 120, the plurality of second conductive vias 138 have a conductive material formed within in order to provide an electrical connection from a plurality of second conductive structures 140 to the interconnect structures 104. The second conductive structures 140 are formed as is known in the prior art and will not be described in detail herein.

A fifth interlevel dielectric 142 forms a top surface 144 of the integrated circuit 100 as shown. However, additional metal layers and other structures can be formed as desired to make the integrated circuit operational. Additional thin film resistors similar to the thin film resistor 102 may be formed at other locations as desired.

Figure 4:
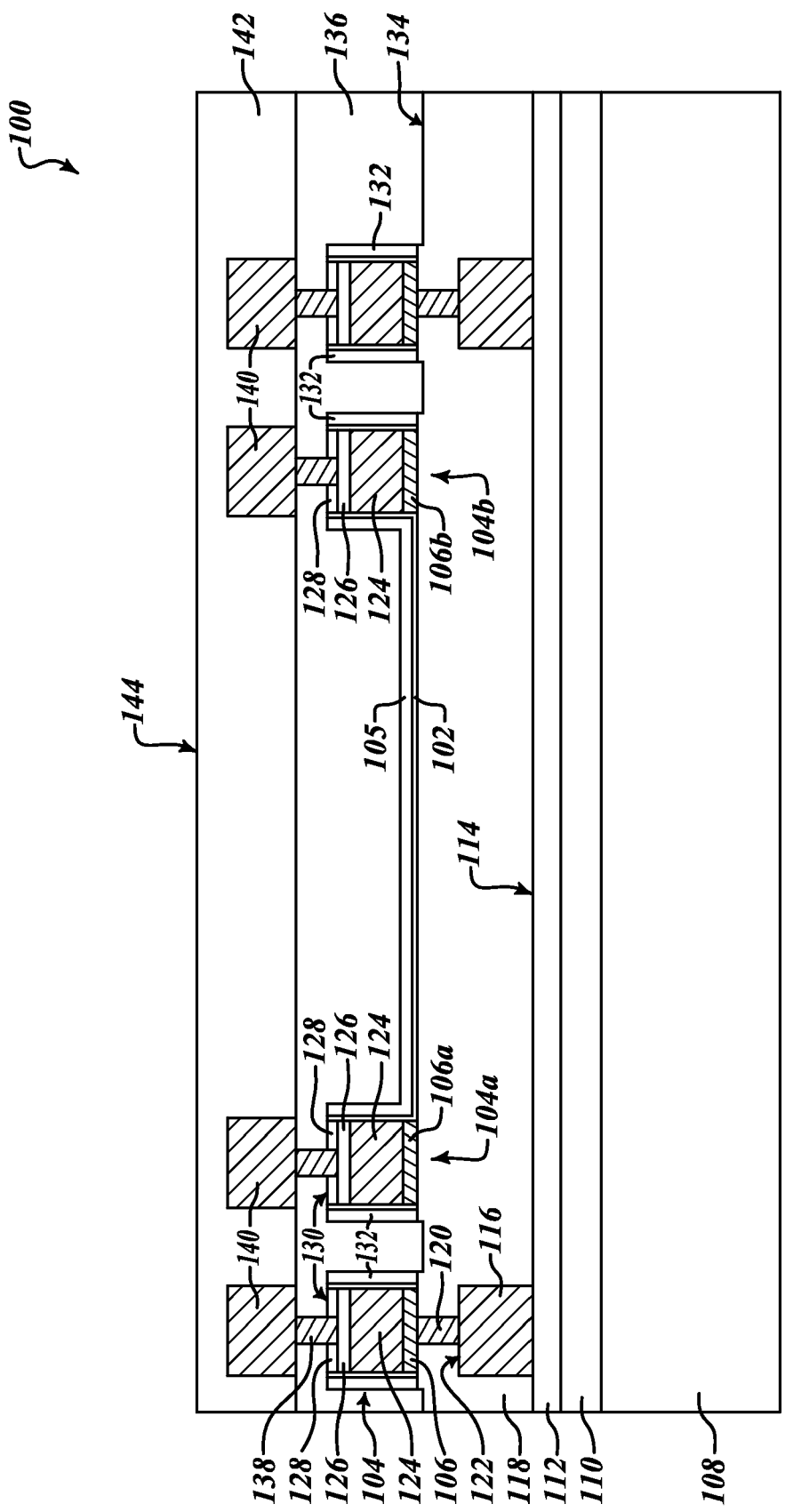
FIG. 4 is a cross-sectional view of the integrated circuit of FIG. 3 having a dielectric cap over the thin film resistor.

FIG. 4 is a cross-sectional view of the integrated circuit 100 having the thin film resistor 102 covered by a dielectric cap 105. In one embodiment, the thin film resistor 102 is chromium silicon and the dielectric cap 105 is silicon nitride. This combination results in the thin film resistor 102 having an ultra low temperature coefficient of resistance of less than 10 ppm/C. The silicon nitride cap protects the chromium silicon from plasma etch steps. If left uncovered, the silicon in the chromium silicon can react with the oxygen in the etch chamber and change the resistance of the thin film resistor layer.

After the cap 105 is formed over the thin film resistor 102, a pattern and etch are performed to form the desired thin film resistor 102. A size and shape of the thin film resistor 102 are related to the desired resistance value for the thin film resistor 102.

Figure 5:
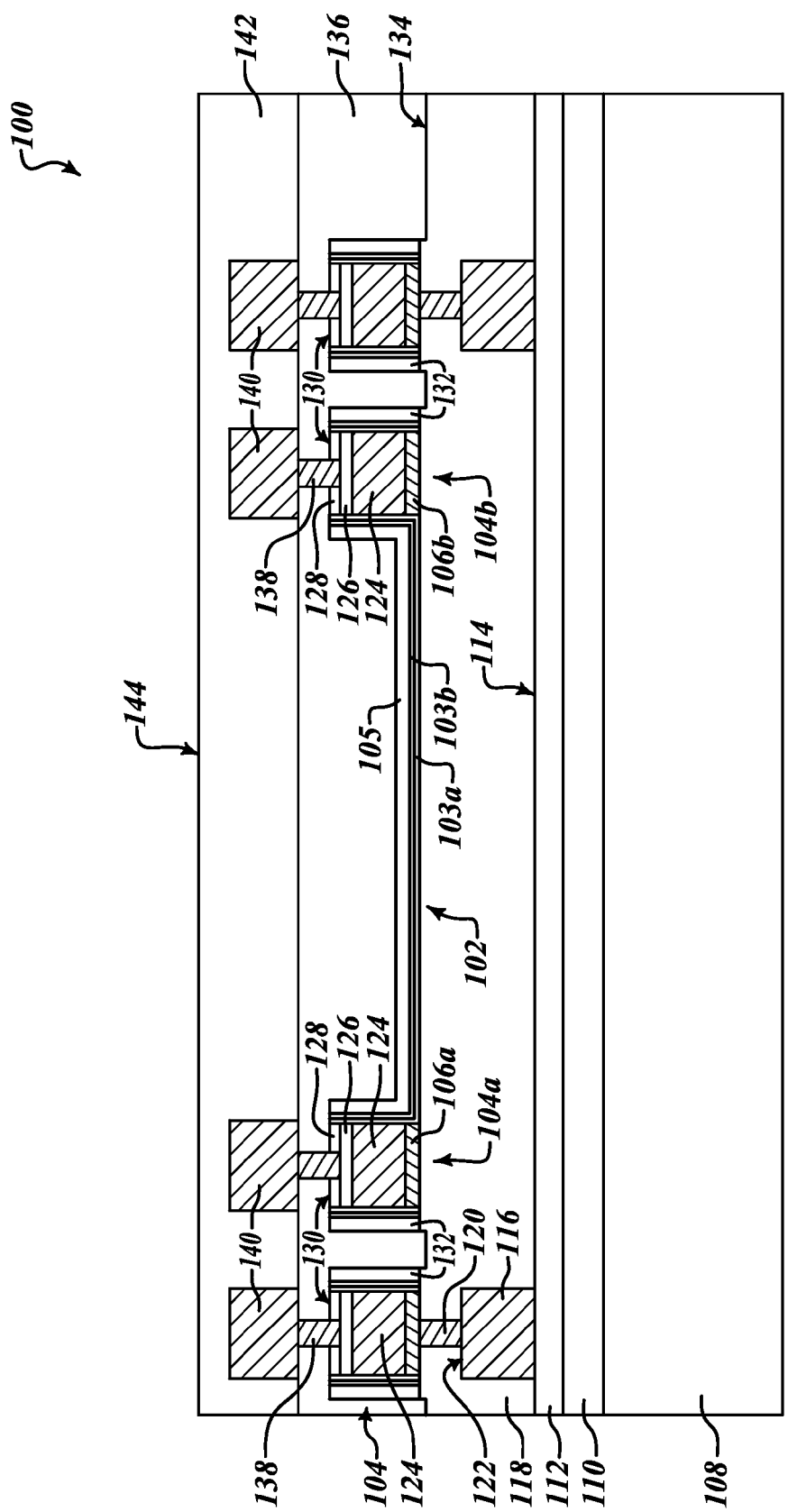
FIG. 5 is a cross-sectional view of the integrated circuit of FIG. 3 having a plurality of resistive layers covered by a dielectric cap.

FIG. 5 is a cross-sectional view of the integrated circuit 100 having a thin film resistor 102 having a first and a second thin film resistor layer 103a, 103b. The thin film resistor 102 is covered by the dielectric cap 105 described above. Precise and reliable resistance values are reproducible by depositing multiple thin film resistor layers in succession. A stack of thin film resistor layers combine the elementary properties of the individual layers. The first and second thin film resistor layers 103a, 103b may be deposited with multiple deposition steps in a single physical vapor deposition machine, without a break in vacuum conditions.

FIGS. 6-11 are cross-sectional views of an integrated circuit 148 at various stages of a method of forming the interconnect structures 104 and the thin film resistor 102. A first conductor layer 152 is formed over a substrate 150, which includes a partially formed integrated circuit structure. Details of the integrated circuit structure are not shown because various components may be included. Similarly to the embodiments shown in FIGS. 3-5, the substrate 150 may include the first and second interlevel dielectrics 110 and 112. The substrate 150 may have a plurality of transistors or active devices, metal layers, and interlevel dielectric layers formed on a monocrystalline silicon chip. Alternatively, the substrate 150 may include all of the components of FIGS. 3-5 that are formed prior to planarizing the third interlevel dielectric 118. The substrate 150 may also include multiple metal layers. Formation of the thin film resistor 102 may be implemented in a variety of locations and at any metal level as needed in the manufacture of the electronic devices.

In one embodiment, the first conductor layer 152 is a 500 to 1,000 angstrom layer of titanium. Titanium is sufficiently conductive to allow good electrical connection between the first conductor 106 and the thin film resistor 102. The first conductor layer may be sputtered or deposited over the substrate 150 to form a conformal layer. Other conductive materials may be substituted for or combined with titanium, such as titanium nitride, titanium tungsten, chromium, tantalum nitride, and tantalum silicon nitride. In one embodiment, the first conductor layer is 500 to 1,000 angstroms in thickness.

A second conductor layer 154 is formed overlying the first conductor layer 152. The second conductor layer 154 may be formed using known metal formation techniques with materials such as aluminum, aluminum copper alloys, copper, or other suitable conductive materials. The second conductor layer 154 may be formed to have a thickness between 2,000 angstroms and 1 micron. The second conductor layer 154 is significantly larger than the first conductor layer 152. In one embodiment, the first conductor layer 152 is a barrier that protects the second conductor layer 154 from diffusion from other elements in the substrate.

An antireflective coating layer 156 is formed overlying the second conductor layer 154. The antireflective coating layer 156 is optional and can be included depending on the type of metal used to form the second conductors 124. The antireflective coating layer 156 may be a 500 angstrom thick layer of titanium nitride. Other suitable antireflective coatings may also be used.

A protective coating layer 158 is formed overlying the antireflective coating layer 156. A material for the protective coating layer 158 is selected to have different etch chemistry from the second conductor 154. For example, the protective coating layer 158 will be a dielectric if the second conductor layer 154 is metallic. This is to prevent an over etch or otherwise act as a stopping layer when future pattern and etch steps threaten to damage the second conductor 154. The protective coating layer 158 may be a deposited layer of silicon dioxide, such as a TEOS layer in the range of 1,000 and 2,000 angstroms in thickness. Alternatively, the protective coating layer 158 may be a silicon nitride, silicon carbide, or other dielectric.

Figure 14:
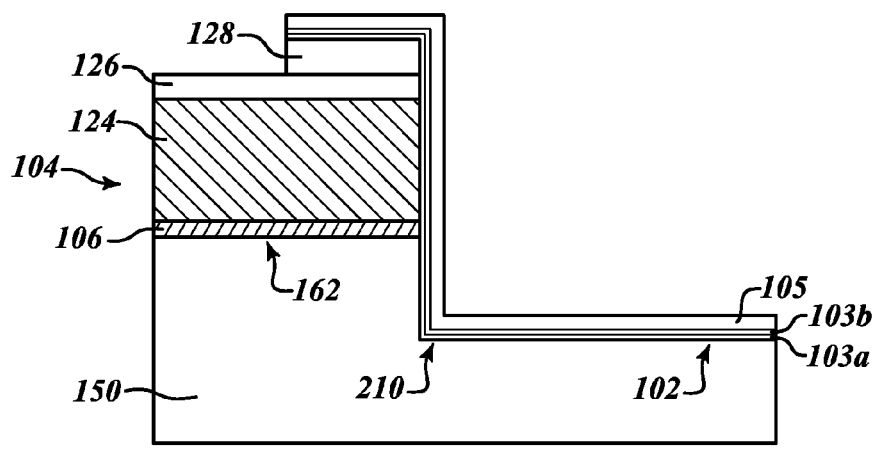
FIG. 14 is a cross-sectional view of an interconnect structure having a plurality of thin film resistor layers covered by a dielectric cap.
Figure 19:
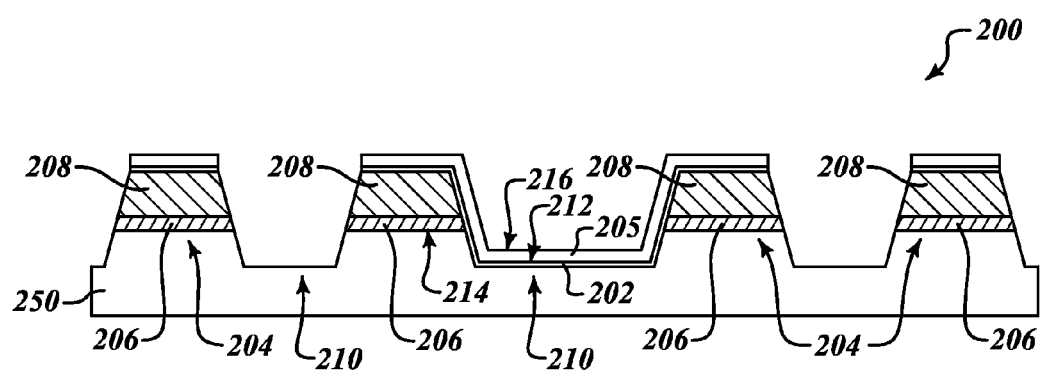
FIG. 19 is a cross-sectional view of a partially formed integrated circuit having a thin film resistor formed in a recess in a substrate between interconnect structures.
Figure 20:
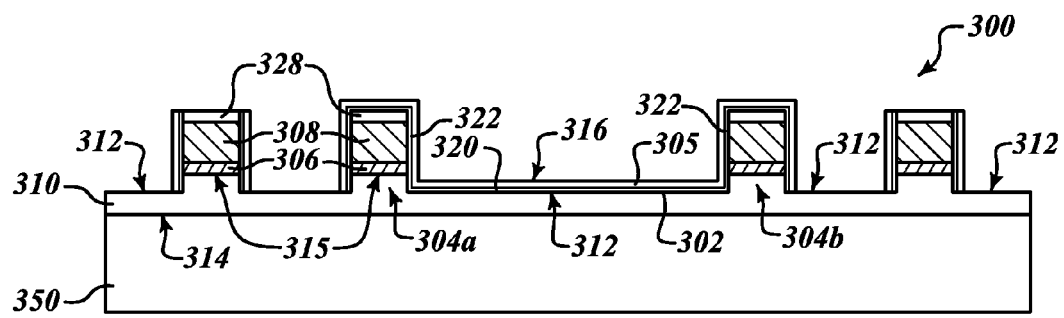
FIG. 20 is a cross-sectional view of a partially formed integrated circuit structure having a thin film resistor formed in a recess in a dielectric layer over a substrate.

After the first conductor layer 152, the second conductor layer 154, and at least the protective coating layer 158 are formed over the substrate 150, a photoresist pattern 160 is formed to define the interconnect structures 104. The photoresist pattern 160 protects the interconnect structures 104 as excess portions of the first conductor layer 152, the second conductor layer 154, the antireflective coating layer 156, and the protective coating layer 158 are removed to reexpose a top surface 162 of the substrate 150, see FIG. 7. The etch used to define the interconnect structures 104 may overetch past the top surface 162 of the substrate 150 and form a recess as shown in FIGS. 14, 19, and 20.

The interconnect structures 104 can be between 5,000 angstroms and 1 micron in thickness. After defining the interconnect structures 104, each interconnect structure 104 includes the first conductor 106, the second conductor 124, the antireflective coating 126, and the protective coating 128 as previously described in FIGS. 3-5.

Figure 8:
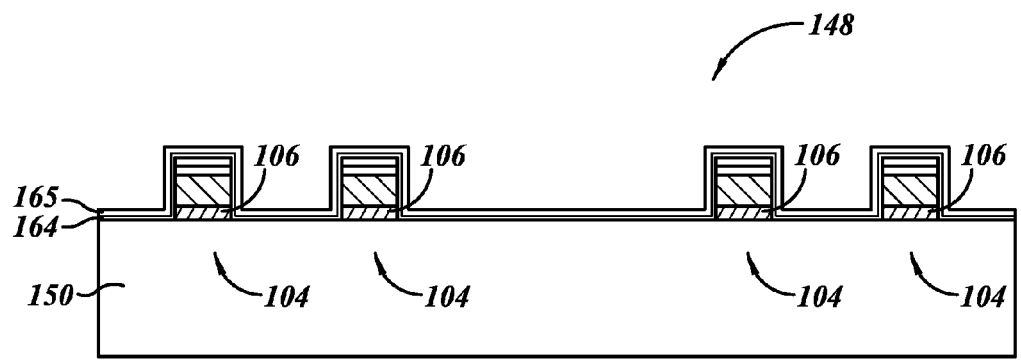

In FIG. 8 a thin film resistor layer 164 is formed overlying the interconnect structures 104 and the top surface 162 of the substrate 150. In one embodiment, the thin film resistor layer 164 is a 50 to 500 angstrom resistive film. However, other thicknesses are possible.

With stability in mind, materials with a low temperature coefficient of resistance are selected, especially since many conductive materials change resistance with changes in temperature. Temperature coefficient of resistance is the resistance-change factor per degree Celsius of temperature change. A positive temperature coefficient of resistance for a material means that its resistance increases with an increase in temperature. Pure metals typically have positive temperature coefficient of resistance. Temperature coefficients of resistance approaching zero can be obtained by alloying certain metals, and thus have negligible variation of temperature.

A negative temperature coefficient of resistance for a material means that its resistance decreases with an increase in temperature. Semiconductor materials, like carbon, silicon, and germanium, typically have a negative temperature coefficient of resistance. Therefore, selection of the material to form the thin film resistor layer 164 will contemplate the temperature coefficient of resistance in light of expected process conditions.

The thin film resistor layer 164 may be chromium silicon, platinum, titanium nitride, tantalum nitride, tantalum aluminum, or nickel chromium, to name a few. As mentioned above, the sheet resistance of the thin film resistor layer 164 depends on the material selected, the length and width of the final resistor 102, and the operating conditions. Variations in the chemical composition of the thin film resistor layer also impact the sheet resistance.

For example, if using chromium silicon as the thin film resistor layer 164 the amount of silicon can be varied to alter the resistance. Chromium silicon with 25% silicon can achieve 1 k ohms/square sheet resistance with a temperature coefficient of resistance of less than 100 ppm/C. If the silicon is increased to 40%, then the chromium silicon layer can achieve 10 k ohms/square sheet resistance with a temperature coefficient of resistance between 100 and 1,000 ppm/C. In addition, if the silicon content is 85%, a 100 k ohms/square sheet resistance with a temperature coefficient of resistance between 1,000 and 10,000 ppm/C can be achieved.

More particularly, a chromium silicon resistor with 25% silicon has a higher sheet resistance with a lower temperature coefficient of resistance than other materials such as tantalum nitride and tantalum aluminum, which both have less than 0.1 k ohms/square with a temperature coefficient of resistance between 50 and 100 ppm/C. The chromium silicon resistor with 40% silicon has a higher sheet resistance of 10 k ohms/square at a temperature coefficient of resistance of 500 ppm/C as compared to a tantalum silicon nitride film, which has a resistance around 0.1 k ohms/square. The chromium silicon with 85% silicon has a higher resistance and a higher temperature coefficient of resistance than a high-ohmic polysilicon resistor or a diffused resistor.

The thin film resistor layer 164 is deposited conformally over the interconnect structures and the top surface of the substrate 150. A physical vapor deposition (PVD) technique or a PVD sputter technique may be used to form the thin film resistor layer 164. For example, a sputtering process, such as Magnetron Sputtering uses a sputter gas, such as argon krypton, supplied to a vacuum chamber. A sputter target, the cathode connected to a DC power supply, is negatively biased. As the cathode voltage increases, electrons are ejected from the sputter target's surface. Electrons collide with the argon atoms in the sputter gas to create $Ar^+$ ions and more electrons. Rotation magnetic fields help maintain plasma by retaining electrons near the target surface. Electrons hop on the target surface area to ionize sputter gas. The $Ar^+$ ions are accelerated across the plasma sheath to kick out atoms from the target surface. Then the sputtered atoms travel across to the substrate where they are deposited as the resistive film.

For example, the PVD sputter technique can be used to form a chromium silicon film using low power, such as 100 Watts with a process temperate of 350 degrees Celsius. Other temperature and power settings are also suitable. Low power is one factor in forming very thin films. In one embodiment, the thin film resistor layer 164 is deposited with an argon gas flow of 45 standard cubic centimeters per minute with a nitrogen gas flow of 2 standard cubic centimeters per minute for 40 to 50 seconds. An increase of nitrogen or oxygen in the deposition chamber results in more negative temperature coefficients of resistance for the thin film.

In one embodiment, the thin film resistor layer has a resistance range between 1 k and 2 k ohms/square. Thin film resistors formed in accordance with the present disclosure can achieve a temperature coefficient of resistance in the range of zero to 100 ppm/C. A low temperature coefficient of resistance depends on the material composition and the sheet resistance. For example, a thin film resistor layer formed from a target of chromium boride (85%), silicon (10%), and silicon carbide (5%) has a sheet resistance of around 2 k ohms/square with a temperature coefficient of resistance in the range of negative 100 ppm/C to positive 150 ppm/C, depending on a thickness of the layer. This combination of materials have bi-modal grains sizes with small grains 3-5 nanometers in diameter and large grain sizes of 10 nanometers in diameter.

In another embodiment, a thin film resistor layer formed from a target of chromium boride (55%), silicon (30%), and silicon carbide (15%) has a sheet resistance of around 5 k ohms/square with a temperature coefficient of resistance around negative 420 ppm/C. This film's temperature coefficient of resistance is weakly dependent on thickness. In yet another embodiment, a thin film resistor layer formed from a target of chromium boride (35%), silicon (45%), and silicon carbide (25%) has a sheet resistance of around 25 k ohms/square with a temperature coefficient of resistance in the range of negative 1,800 ppm/C and negative 1,500 ppm/C, depending on the thickness of the layer.

Both the thin film resistor layer properties and the deposition conditions impact the resistance and temperature coefficient of resistance of the thin film resistor. Controlling the target's condition and the deposition conditions contribute to obtaining a low temperature coefficient of resistance. Forming the thin film resistor layer 164 laterally connecting sidewalls of adjacent interconnect structures allows precise control of resistance and temperature coefficient of resistance. For example, a high resistance in a small area, such as a sheet resistivity in the range of 2,000 to 3,000 ohms/square, may be achieved.

A good electrical connection is achieved between the thin film resistor layer 164 and the first conductors 106 in each interconnect structure 104. The reduced thickness of the thin film resistor layer 164 and the lateral electrical connection allows a significant reduction in thickness of the integrated circuit 148.

After the thin film resistor layer 164 is formed, a dielectric cap layer 165 is formed overlying the thin film resistor layer 164. The dielectric cap layer 165 may have a thickness in the range of 200 to 1,000 Angstroms. The dielectric cap layer 165 is a dielectric that provides protection and stability for the thin film resistor layer 164. The dielectric cap layer 165 adds stability to the thin film resistor 102 without increasing the size of the integrated circuit 148. Including the dielectric cap layer 165 over the thin film resistor layer 164 provides long term resistance stability and generates improved voltage coefficients.

In one embodiment, the thin film resistor layer 164 is a 50 to 100 angstrom chromium silicon layer and the dielectric cap layer 165 is a silicon nitride cap layer in the range of 200 to 500 angstroms. Utilizing chromium silicon with silicon nitride achieves a stable sheet resistance with an ultra low temperature coefficient of resistance, such as a temperature coefficient of resistance between negative 10 ppm/C and positive 10 ppm/C. In other embodiments, a temperature coefficient of resistance in the range of negative 250 ppm/C and positive 250 ppm/C can be achieved. With specialized processing, a temperature coefficient of resistance of zero can be achieved.

After the thin film resistor layer 164 is deposited, a hard mask may be deposited to permanently protect the thin film resistor. For example, a titanium tungsten barrier layer may be deposited. The hard mask will protect the thin film resistor from chemically reacting with subsequent insulation or passivation layers. In locations where vias are formed, the hard mask can be removed with a wet etch, such as with hydrogen peroxide.

Figure 9:
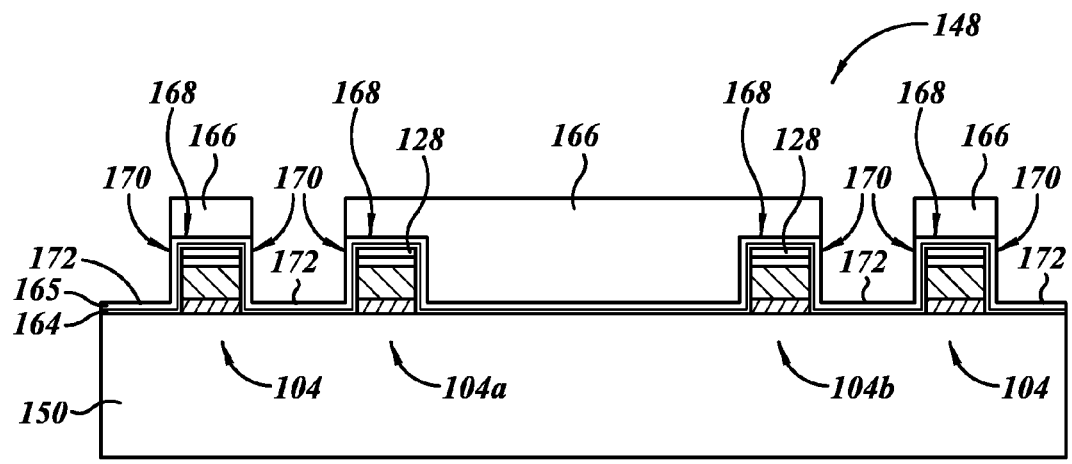

In FIG. 9, a photoresist pattern 166 defines the thin film resistor 102 from the thin film resistor layer 164. The photoresist pattern 166 covers a top surface 168 of the dielectric cap layer 165 over the interconnect structures 104. The photoresist pattern 166 also covers the dielectric cap layer 165 over the thin film resistor 102 to be defined between the first interconnect structure 104a and the second interconnect structure 104b. The complexity of the masking can be reduced by only covering the desired thin film resistor 102.

A spacing between the interconnect structures 104 can be reduced as a result of incorporating the protective coating 128 in the interconnect structures 104. As the integrated circuit 148 is scaled to be smaller and smaller, the spacing between the interconnect structures is reduced. The challenge is to open the space between interconnect structures 104 not connected by the thin film resistor 102. The protective coating 128 allows reduced coverage by the photoresist pattern.

In FIG. 9, the photoresist pattern 166 extends to edges 170 formed by vertical portions of the thin film resistor layer 164 and the dielectric cap layer 165 along vertical portions of the interconnect structures 104. Only horizontal portions 172 of the thin film resistor layer 164 and the dielectric cap layer 165 are exposed to an etch intended to define the thin film resistor 102 between the first and second interconnect structures 104a, 104b.

The photoresist pattern 166 could extend past edges 170 to cover an amount of the horizontal portions 172 of the thin film resistor layer 164. As mentioned above, the challenge is to open and fully remove the thin film resistor layer 164 between interconnect structures 104 not connected by the thin film resistor 102. When the photoresist pattern 166 extends past the edges 170, opening the small spacing between the interconnect structures becomes more challenging. Having the photoresist pattern 166 extend past the edges 170 risks shorting the thin film resistor by not etching enough of the horizontal portions 172.

By incorporating the protective coating 128 in the interconnect structures the photoresist pattern 166 can be formed to be flush with the edges 170 or may only partially cover the top surface 168 of the interconnect structures 104. The photoresist pattern 166 can be incorporated in less than sub-half-micron technologies and allow for sufficient removal of the horizontal portions 172 between adjacent interconnect structures 104.

The etch to remove the horizontal portions 172 of the thin film resistor layer 164 can also etch the second conductors 124. Depending on the severity of the over etch, the integrity of the affected interconnect structure may be compromised to a non-operational level. If the protective coating 128 is not included, there is a risk that the second conductors 124 will be damaged when the etch removes the thin film resistor layer 164 from the top of the interconnect structures 104. This risk is particularly acute when considering the difficulty in accurately and robustly stopping the etch, such as with endpoint detection. With the protective coating 128, any misalignment of the photoresist pattern 166 or intentional partial exposure of the top surface 168 is not a problem because the protective coating 128 will prevent the etch from damaging the second conductors 124. For example, using TEOS as the protective coating 128 protects the second conductors 124 when removing the thin film resistor layer 164 since a dielectric has a different etch chemistry than the thin film resistor layer.

The photoresist pattern 166 provides a minimum spacing between interconnect structures 104 where the horizontal portions 172 of the thin film resistor layer 164 are desired to be removed. Even if mask misalignment causes the photoresist pattern 166 to be located inward from the edge 170, the interconnect structures will not be damaged by the etch.

Figure 10:
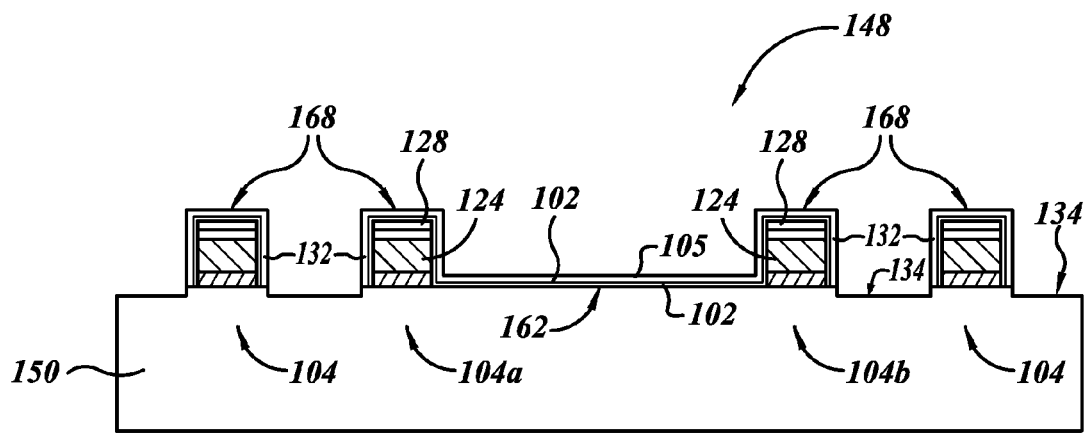

FIG. 10 is a cross-sectional view of the integrated circuit 148 after the etch to define the thin film resistor 102. The thin film resistor layer remains intact over each interconnect structure 104 since the photoresist pattern 166 extended to the edges 170. The etch to define the thin film resistor 102 and to remove the horizontal portions 172 is long enough to fully remove the horizontal portions 172. If the etch is not complete and some of the horizontal portions 172 remain, the integrated circuit 148 may not function because the interconnect structures 104 may remain electrically connected through the thin film resistor 102. In order to ensure separation, the etch may be prolonged to over etch and expose the surface 134 of the substrate 150, which is below the top surface 162. By covering the thin film resistor 102 during the etch with the photoresist pattern 166, the small amount of space between the interconnect structures 104 can be opened up.

The vertical portions 132 that remain after removing the horizontal portions 172 protect the interconnect structures 104 from being undercut during the etch. A thickness of the vertical portions 132 may be reduced during the etch to remove the horizontal portions 172.

The photoresist pattern 166 may be formed to only cover a portion of the top surface 168 of the dielectric cap layer 165 over the thin film resistor layer 164 that is over the first and second interconnect structures 104a, 104b and to not cover the other interconnect structures 104 not covered by the photoresist pattern 166. The etch to remove the horizontal portions 172 of the thin film resistor layer 164 and the dielectric cap layer 165 will expose the surface 134 of the substrate 150. The etch will also remove the dielectric cap layer 165 and the thin film resistor layer 164 not protected by the photoresist pattern 166 on the top of the interconnect structures 104 not associated with the thin film resistor 102. Some or all of the protecting coating 128 may be removed from these other interconnect structures 104.

The antireflective coating 126 may be reexposed by this etch. In embodiments where the antireflective coating 126 is omitted, the thickness of the protective coating 128 may be selected to prevent damage to the second conductor 124. If the photoresist pattern does not cover all of the interconnect structures, the uncovered interconnect structures will not require additional processing before protecting them with the fourth interlevel dielectric 136 and forming the plurality of second conductive vias 138 (as shown in FIG. 3).

Figure 11:
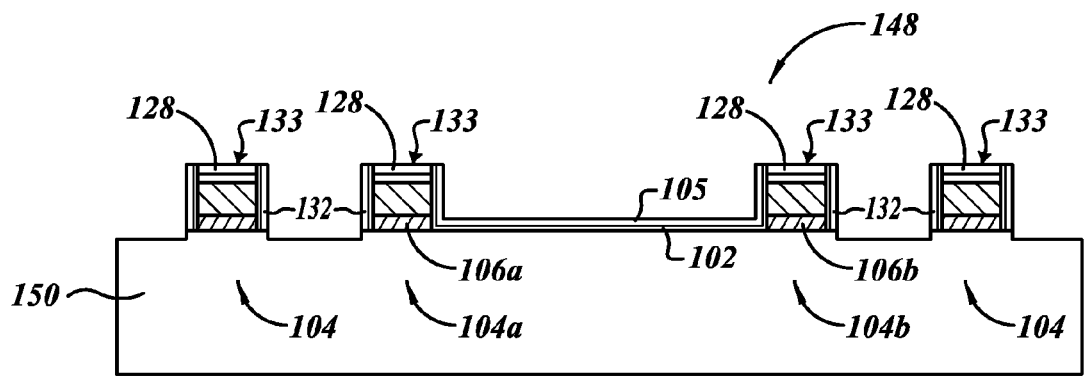

FIG. 11 is the integrated circuit 148 after removal of the dielectric cap layer 165 and the thin film resistor layer 164 that remained on the interconnect structures 104 after removing the horizontal portions 172 of the thin film resistor layer 164. Some or all of the protective coating 128 may be removed when thin film resistor layer 164 is removed from the top of the interconnect structures 104.

A top surface 133 of the protective coating 128 is exposed. This may be achieved in a variety of ways. For example, a dielectric layer (not shown) may be formed over the integrated circuit 148 and then a chemical mechanical polish may be used to expose the top surface 133. Alternatively, the photoresist pattern 166 may be formed to only cover the thin film resistor 102 such that the other top surface 133 is exposed when the horizontal portions 172 are removed.

The thin film resistor 102 connects adjacent interconnect structures directly together without needing vias to connect the resistor to the interconnects. This significantly reduces the space used to form the integrated circuit 148. In addition, the space between interconnect structures can be reduced when the protective coating 128 is incorporated in the interconnect structures.

A resistance of the thin film resistor 102 may be calculated by the following equation:

$$R_{total}=2((R_{CS}//R_{top}//R_{side})+R_{angle})+R_{TF},$$

where $R_{CS}$ is the resistance of the second conductor 124, $R_{top}$ is the resistance of a horizontal contact that forms the top surface 168 of the thin film resistor 102 on the first and second interconnect structures 104a, 104b, and $R_{side}$ is the resistance of a vertical contact of the thin film resistor 102 adjacent sidewalls of the first and second interconnect structures 104a, 104b. $R_{angle}$ is the resistance at a contact angle between the thin film resistor 102 and the first conductors 106. $R_{TF}$ is the resistance of the thin film resistor 102. The equation determines the resistance of $R_{CS}$ in parallel with $R_{top}$ in parallel with $R_{side}$. The overall resistance is most impacted by the $R_{angle}$ between the first conductors 106 and the thin film resistor 102. When $R_{CS} \ll R_{top}$ and $R_{LC}$, then $R_{total}$ is approximately equal to $2(R_{CS}+R_{angle})+R_{TF}$.

Figure 12:
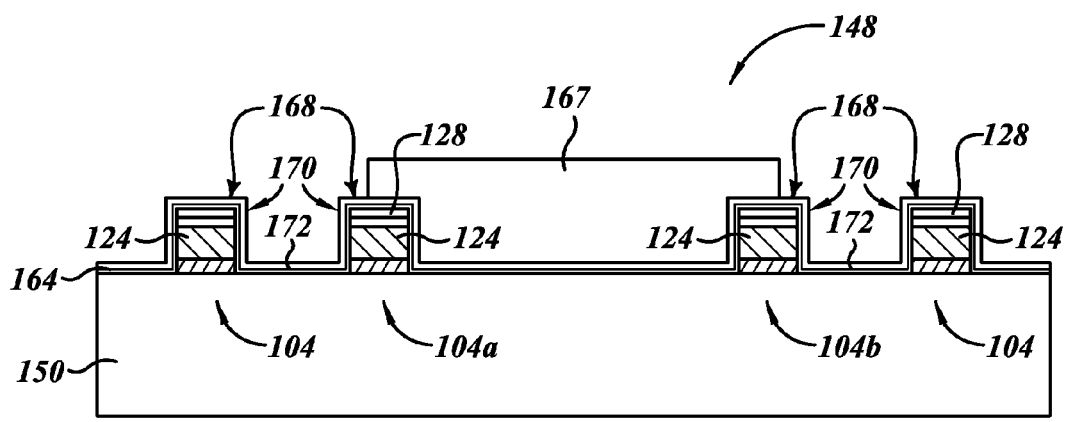
FIGS. 12 and 13 are cross-sectional views of an alternative process to form interconnect structures and a thin film resistor.

FIG. 12 is a cross-sectional view of the integrated circuit 148 having an alternative photoresist pattern 167 formed over the thin film resistor 102. The photoresist pattern 167 is intentionally formed inward from the edge 170 on the top surface 168 of the interconnect structures 104. In this circumstance, the protective coating 128 prevents the etch from damaging the second conductor 124 in the interconnect structures 104 during an uncovered etch.

The photoresist pattern 167 may be formed to only cover a portion of the top surface 168 of the thin film resistor layer 164 over the first and second interconnect structures 104a, 104b. The top surface 168 of the other interconnect structures 104 are not covered by the photoresist pattern 167. As described above, the protective coating 128 may be a TEOS layer or other silicon dielectric layer. The protective coating 128 may also be a plurality of layers tailored to protect the second conductors 124 and depending on the type of material used for the second conductors 124.

Figure 13:
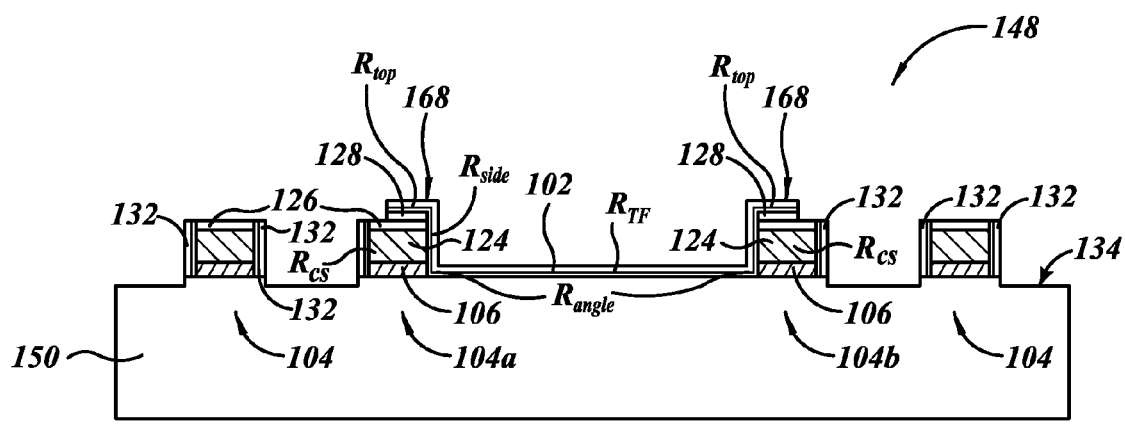

FIG. 13 is a cross-sectional view of the integrated circuit 148 of FIG. 12 after the thin film resistor 102 has been defined and the photoresist 167 has been removed. As the etch removes the horizontal portions 172 of the thin film resistor layer 164, the surface 134 of the substrate 150 is exposed and the thin film resistor layer 164 not protected by the photoresist pattern 167 is removed from the top of the associated interconnect structures 104. Some or all of the protective coating 128 may be removed from these interconnect structures 104.

A portion of the top surface 168 of the first and second interconnect structures 104a, 104b exposed by the photoresist pattern 167 is removed during the etch. Some or all of the protective coating 128 is also removed during the etch and the antireflective coating 126 is reexposed. In embodiments where the antireflective coating 126 is omitted, the thickness of the protective coating 128 may be selected to prevent damage to the second conductor 124. In FIG. 13, the interconnect structures do not require additional processing before protecting them with the fourth interlevel dielectric 136 and forming the plurality of second conductive vias 138 (as shown in FIG. 3).

FIG. 14 is an enhanced view of one of the interconnect structures 104 electrically connected to the thin film resistor 102 through the first conductor 106. The interconnect structure 104 includes the second conductor 124 over the first conductor 162 and the antireflective coating 126 over the second conductor 124. Only a portion of the protective coating 128 remains after the thin film resistor 102 is defined from the first and second thin film resistor layers 103a, 103b. A photoresist pattern similar to the photoresist pattern 167 in FIG. 12 was used to define the thin film resistor 102.

In FIG. 14, the thin film resistor 102 is formed in a recess 210 in the substrate 150. The recess 210 is formed when the interconnect structures 104 are formed over the substrate 150. The etch to define the individual interconnect structures can over etch the substrate 150 and form the recess 210. The thickness of the first and second thin film resistor layers 103a, 103b and the dielectric cap 105 are significantly less than a depth of the recess 210 below the top surface 162 of the substrate 150.

In all of the embodiments described herein, the thin film resistor may be a single thin film resistor or a plurality of thin film resistor layers. As described above, the formation of the thin film resistor layers depend on the target material and gas and temperature conditions of the deposition chamber. A plurality of layers having different chemical compositions can be deposited to achieve a desired resistance value for the thin film resistor. For example, the first resistor layer 103a may be a chromium silicon film having a negative temperature coefficient of resistance, such as −360 ppm/C. The second resistor layer 103b may be another chromium silicon film having a positive temperature coefficient resistance, such as +400 ppm/C. A resistance value of the thin film resistor can be determined by calculating the parallel resistance values of the first and second resistor layers 103a, 103b. A near zero temperature coefficient of resistance can be achieved by forming the first resistive layer having the negative temperature coefficient resistance and the second resistive layer the positive temperature coefficient resistance.

In one embodiment, the first resistive layer 103a has a thickness in the range of 100 and 150 angstroms. The second resistive layer 103b has a thickness in the range of 20 and 50 angstroms. The first resistive layer 103a acts as a liner, electrically coupling the second resistive layer 103b to the interconnect structures. The first resistive layer 103a provides better continuity for the lateral contact. The first and second resistive layer 103a, 103b may be alloys formed from the same elements, but having different resistance values and different temperature coefficients of resistance caused by variations in deposition techniques. Alternatively, the first and second resistive layers may be alloy compositions that are formed from different elements.

The first and second resistive layers 103a, 103b may be various thicknesses and have various sheet resistances. The vertically stacked arrangement of the first and second resistive layers is a parallel resistor structure. The deposition target and gas conditions are selected for each resistive layer so that the overall resistance of the plurality of resistive layers in parallel equals a desired resistance value for the thin film resistor.

In one embodiment, the target for first resistor layer 103a could be chromium boride (85%), silicon (10%), and silicon carbide (5%). The target for the second resistor layer 103b could be chromium boride (55%), silicon (30%), and silicon carbide (15%). A third resistor layer (not shown) could be formed on the second resistor layer 103b from a target of chromium boride (35%), silicon (45%), and silicon carbide (25%). The combination of the first, second, and third resistor layers forms the thin film resistor 302. In one embodiment, the thin film resistor having three resistive layers formed in accordance with the above referenced targets has a sheet resistance of 200 ohms/square and a temperature coefficient of resistance near zero ppm/C.

The plurality of thin film resistor layers can be deposited with a single machine without disrupting vacuum conditions. The plurality of films will compensate each other to achieve desired electrical properties. For example, a film with a negative temperature coefficient of resistance can be covered with a film having a positive temperature coefficient of resistance. The combination of the positive and negative temperature coefficients of resistance provide for near zero temperature coefficient of resistance values. The plurality of thin film resistor layers provide for stable sheet resistances of less than one percent variation across a wafer.

Figure 15:
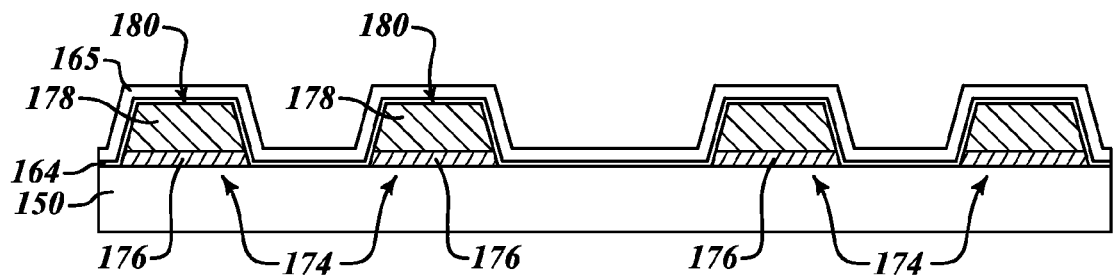
FIGS. 15-18 are cross-sectional views of yet another alternative process to form interconnect structures and a thin film resistor.

FIGS. 15-18 are cross-sectional views of another embodiment of the thin film resistor 102 laterally connecting sloped interconnect structures 174 over the substrate 150. In FIG. 15, the sloped interconnect structures 174 include a titanium conductor layer 176 and a metal layer 178. The titanium conductor layer 176 may be formed directly on the substrate 150 or spaced from the substrate by a dielectric layer (not shown). In an alternative embodiment, the titanium conductor layer may include a titanium layer and a titanium nitride layer.

As described above, other materials besides titanium may be used for the conductor layer 176.

The metal layer 178 may be aluminum, copper, or other metallic materials. For example, the metal layer 178 may have an aluminum copper silicon composition. The sloped interconnect structures 174 have angled sidewalls such that the interconnect structures are trapezoidal, i.e., tapered toward an upper surface 180. The optimized profile of the interconnect structures is a compromise between the vertical and sloped sidewalls in FIGS. 3 and 15, respectively.

Having an angled sidewall of the conductor layer 176 can enhance the performance of the thin film resistor 102 between the sloped interconnect structures 174. The thin film resistor 102 is formed from a thin film resistor layer 164 in accordance with the methods and compositions described above. The dielectric cap layer 165 is formed over the thin film resistor layer 164 for stability.

Figure 16:
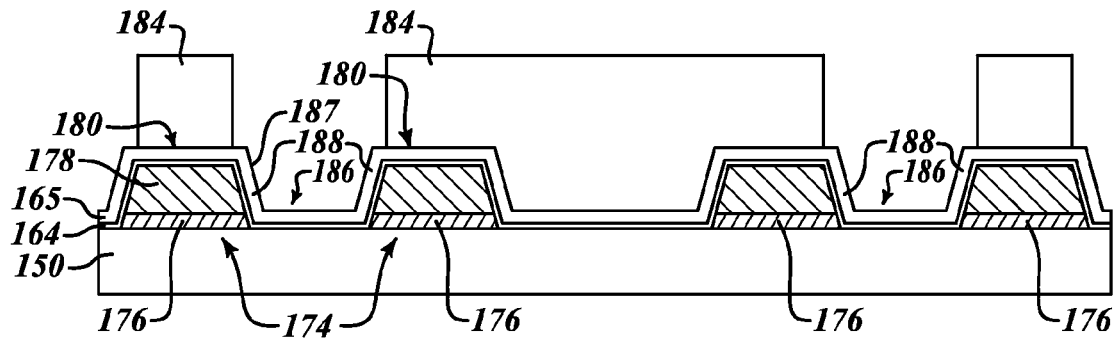

In FIG. 16, a photoresist pattern 184 is formed over the sloped interconnect structures 174 such that a portion of the upper surface 180 is covered. The photoresist pattern 184 is inward from an edge 187 of the dielectric cap layer 165, which begins the slope down toward horizontal portions 186. Alternatively, the photoresist pattern 184 may extend to the edge 187 of the dielectric cap layer 165. Having the photoresist pattern 184 extend over the full top surface 180 of the interconnect structures 174 provides protection for the top surface. Accordingly, the protective coating 128 described above, can be omitted.

Figure 17:
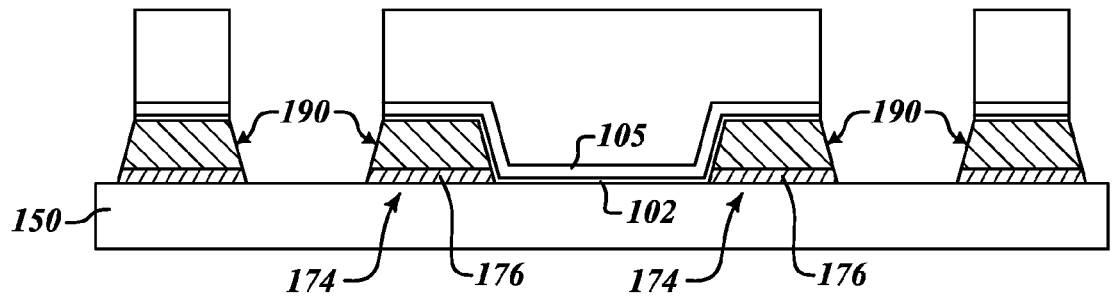

FIG. 17 is the cross-sectional view of the thin film resistor 102 after the etch removes the horizontal portions 186 not protected by the photoresist pattern 184. Vertical portions 188 of the thin film resistor layer 164 are completely removed if the photoresist pattern 184 only covers the upper surface 180 of the sloped interconnect structures 174. However, if the photoresist pattern 184 extends past the upper surface 180, portions or all of the vertical portions 188 may remain on sidewalls 190 of the sloped interconnect structures 174.

The thin film resistor 102 electrically connects the sloped interconnect structures 174 through the conductor layer 176. This lateral connection provides the thin film resistor on the integrated circuit without the extra interlevel dielectrics and vias typically used for precision resistors. Therefore the overall dimension of the integrated circuit is reduced.

Figure 18:
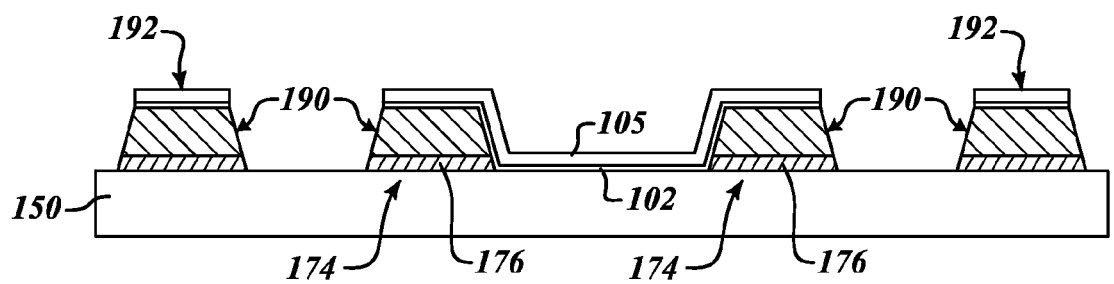

FIG. 18 is the thin film resistor 102 with the cap 105 after the photoresist is removed. Various interlevel dielectrics and vias may be formed to couple the thin film resistor to other interconnect structures in the integrated circuit, as shown in FIG. 3. Upper horizontal portions 192 can be removed or vias can be formed through the upper horizontal portions 192 to electrically connect the interconnect structures to other components in the integrated circuit.

FIG. 19 is yet another embodiment of an integrated circuit 200 having a thin film resistor 202 with a dielectric cap 205. The integrated circuit 200 includes a substrate 250 that may have a plurality of active devices formed therein. A plurality of sloped interconnect structures 204 are formed over the substrate 250. Each interconnect structure 204 includes a first conductor 206 and a second conductor 208 and has sidewalls that are transverse to a top surface 214 of the substrate 250. During the formation of the interconnect structures recesses 210 are formed in the substrate 250 between the interconnect structures 204. The recesses 210 may be formed by over-etching the interconnect structures and by removal of the photoresist.

Subsequently, the thin film resistor 202 is deposited and covered with the dielectric cap 205. The thin film resistor 202 has a top surface 212 below the top surface 214 of the substrate 250. The dielectric cap 205 also has a top surface 216 below the top surface of the substrate 250. The thin film resistor 202 and the dielectric cap 205 are significantly smaller than the interconnect structures and smaller than the first conductors 206.

FIG. 20 is a cross-sectional view of an integrated circuit 300 having a thin film resistor 302 connecting first and second interconnect structures 304a, 304b. The thin film resistor 302 is protected from subsequent processing steps by a dielectric cap 305. The integrated circuit 300 includes a substrate 350, which may include a plurality of active devices, such as CMOS and bipolar transistors. A top surface 314 of the substrate 350 may be may be a planarized layer of dielectric material formed over the transistors or other metal levels.

Over the substrate 350, a first dielectric layer 310 is formed. The first dielectric 310 may be a silicon nitride layer or other dielectric material. A plurality of interconnect structures 304, including first and second interconnect structures 304a, 304b, are formed over the first dielectric layer 310. An etch used to define the interconnect structures 304 may overetch the first dielectric layer 310 and form a recessed surface 312.

The interconnect structures 304 include a first conductor 306 over the first dielectric layer 310 and a second conductor 308 over the first conductor 306. A protective coating 328 is formed over the second conductor 308. The protective coating 328 prevents the second conductor 308 from damage during an etch to define the thin film resistor 302. In FIG. 20, a photoresist pattern (not shown) was used that fully covered a top surface of the thin film resistor 302 and the dielectric cap 305 over the first and second interconnects 304a, 304b. The other interconnect structures 304, adjacent the first and second interconnect structures 304a, 304b were not protected by the photoresist pattern. The protective coating 328 prevents the etch that removes the excess thin film resistor 302 from damaging the second conductors 308.

The thin film resistor 302 and the dielectric cap are formed over the interconnect structures 304 and over the recessed surface 312 of the first dielectric layer 310. Accordingly, a top surface 316 of the dielectric cap 305 is below a top surface 315 of the first dielectric layer 310. The thin film resistor 302 is formed to have a first portion 320 in contact with the recessed surface 312 of the first dielectric layer 310 between the first and second interconnect structures 304a, 304b. The thin film resistor 302 also has second portions 322 in contact with sidewalls of the first and second interconnect structures 304a, 304b.

The configuration of the thin film resistor 302 between the first dielectric layer 310 and the dielectric cap 305 assists in heat dissipation, thereby making the film more stable. The heat is propagated from the thin film resistor to the first and second conductors, avoiding temperature extremes that can be caused by the joule effect. This also results in more stable current values per changes in operating temperature of the thin film resistor 302. In one embodiment, the first dielectric 310 and the dielectric cap 305 are silicon nitride.

Figure 21:
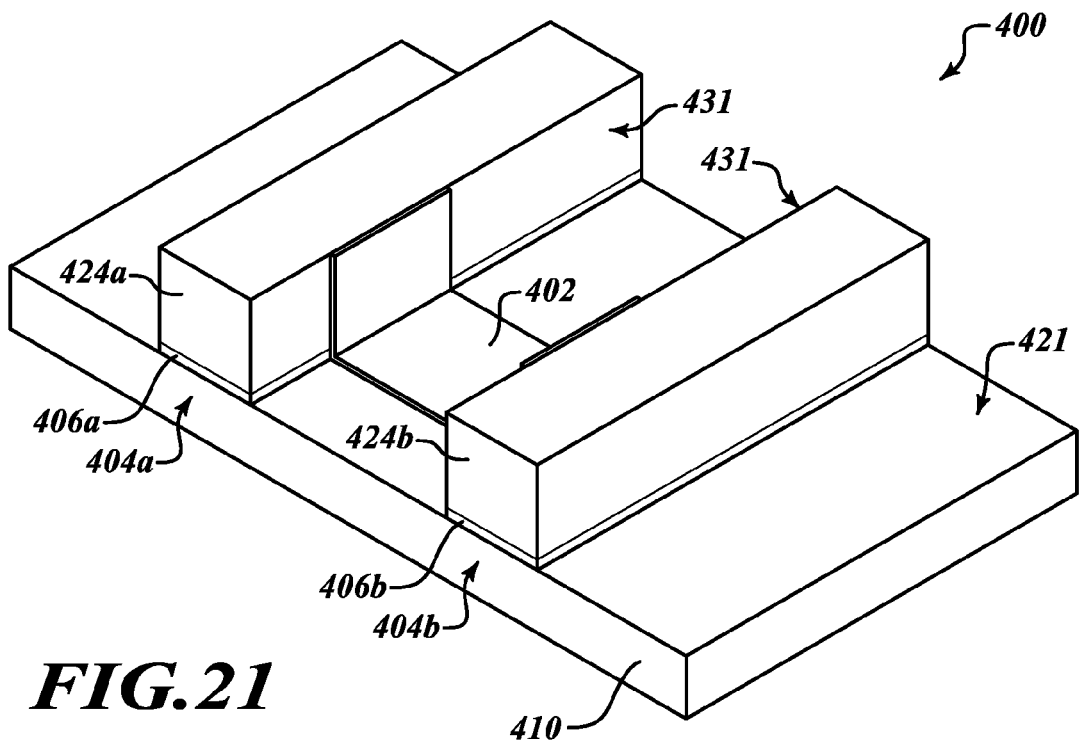
FIG. 21 is a simplified isometric view of a thin film resistor laterally connecting adjacent interconnect structures according to an embodiment of the present disclosure.

FIG. 21 is a simplified isometric view of a partial integrated circuit 400 having a first interconnect structure 404a spaced from a second interconnect structure 404b formed on a planar surface 421 of a dielectric layer 410. The dielectric layer 410 may be formed over a substrate that has active and passive devices formed thereon.

A thin film resistor 402 laterally connects sidewalls 431 of the first and second interconnect structures 404a, 404b together. The first and second interconnect structures 404a and 404b each include a first conductive layer 406a, 406b and a second conductive layer 424a, 424b, respectively.

The first and second interconnect structures 404a, 404b extend across the planar surface 421 to connect various electronic components formed in and over the substrate. The thin film resistor 402 is formed over a portion of the substrate between the first and second interconnect structures 404a, 404b. The size of the portion of the substrate covered by the thin film resistor will vary depending on the desired resistive value and characteristics of the resistive material used to form the thin film resistor.

Figure 22:
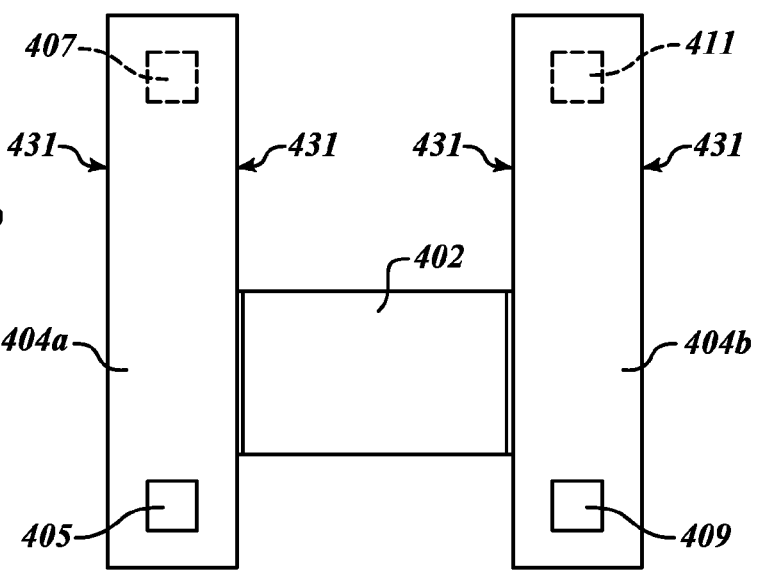
FIG. 22 is a top down view of the thin film resistor and the interconnect structures of FIG. 21.

FIG. 22 is a top down view of the partial integrated circuit 400 of FIG. 21. The first interconnect structure 404a extends between a first contact 405 and a second contact 407, which are spaced from each other on the integrated circuit. The first contact 405 may couple to an upper metal level in the integrated circuit 400. For example, the first contact 405 may connect to one of the plurality of first conductive vias 120 in FIG. 3 that connects the first interconnect structure 104a to one of the second conductive structures 140. The second contact 407 may couple to an active element at a level below the first interconnect structure 404a. For example, the active element may be a transistor or a first metal level of the integrated circuit 400, such as metal one.

The second interconnect structure 404b extends between a third contact 409 and a fourth contact 411, which are spaced from each other on the integrated circuit 400. As with the first and second contacts 405, 407 of the first interconnect structure 404a, the third and fourth contacts 409, 411 connect the second interconnect structure to other elements of the integrated circuit 400. The third contact 409 couples the second interconnect structure 404b to an element (not shown) that is above the second interconnect structure in the integrated circuit 400. The fourth contact 411 couples the second interconnect structure 404b to another element (not shown) that is below the second interconnect structure 404b on the integrated circuit 400.

The thin film resistor 402 is formed to abut sidewalls 431 of the first and second interconnect structures 404a, 404b, electrically connecting the interconnect structures together. In one embodiment, the thin film resistor 402 is formed adjacent the first contact 405 and the third contact 409 of the first and second interconnect structures 404a, 404b, respectively.

An alternative embodiment, not shown in the figures, uses additional process steps to obtain a first conductor that is wider than the second conductor so that more of the thin film resistor is in contact with the first conductor. The first conductor could form a step having a top surface and a sidewall onto which the thin film resistor may be formed. Accordingly, the thin film resistor would have direct electrical contact with the top and sidewall instead of only the sidewall.

Advantages of the uncovered etch of the thin film resistor layer to form the thin film resistor include overcoming mask overlay process margin constraints and allows for integration of the thin film resistor into existing products with minimal space between interconnect structures. Prior art methods use a mask for the resistor and for the metal lines, with an overlap. This method improves process margins and robustness for masking because the manufacturer only needs to mask thin film resistor areas. The simpler masking reduces time and material costs. Also manufacturing constraints based on choosing thin film materials to have either good etch selectivity to metal or to the antireflective coating or to have observable endpoint trace differences for endpoint detection are removed.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first interconnect spaced from a second interconnect over a substrate, the forming comprising:
      forming a first conductor over the substrate;
      forming a second conductor over the first conductor; and
      defining the first and second interconnects by removing portions of the first and second conductors and forming first and second sidewalls of the first and second interconnects, respectively, the first and second sidewalls being transverse to the substrate;
   forming a resistive layer over the first and second interconnects;
   forming a dielectric cap layer over the resistive layer; and
   forming a capped thin film resistor electrically connecting a first remaining portion of the first conductor in the first interconnect to a second remaining portion of the first conductor in the second interconnect, the forming including removing portions of the resistive layer and the dielectric cap layer.

2. The method of claim 1 wherein the capped thin film resistor includes a first portion over the substrate between the first and second interconnects and second portions transverse to the first portion, the second portions abutting the first and second sidewalls of the first and second interconnects, respectively.

3. The method of claim 1 wherein a top surface of the capped thin film resistor is below a top surface of the substrate.

4. The method of claim 1 wherein forming the resistive layer includes depositing a chromium silicon film by sputtering.

5. The method of claim 1 wherein the dielectric cap is silicon nitride.

6. The method of claim 1 wherein forming the resistive layer includes forming a first resistive layer over the substrate and forming a second resistor layer over the first resistor layer.

7. The method of claim 6 wherein the first resistive layer has a first temperature coefficient of resistance and the second resistive layer has a second temperature coefficient of resistance having an opposite sign from first temperature coefficient of resistance.

8. A method, comprising:
   forming a first conductive layer over a substrate;
   forming a second conductive layer over the first conductive layer;
   removing portions of the first and second conductive layers to form a first interconnect structure and a second interconnect structure spaced from the first interconnect structure over the substrate, each interconnect structure including a respective portion of the first conductive layer and a respective portion of the second conductive layer;
   forming a resistive layer over the first and second interconnect structures and the substrate; and
   defining a thin film resistor electrically connecting sidewalls of the first conductive layers of the first and second interconnect structures to each other, the defining including removing portions of the resistive layer.

9. The method of claim 8, further comprising:
   forming a protective coating over the second conductive layer prior to forming the first and second interconnect structures.

10. The method of claim 8 wherein defining the thin film resistor further comprises:
    forming a photoresist layer over portions of a top surface of the first and second interconnect structures and over a portion of the substrate between the first and second interconnect structures; and
    etching the resistive layer to expose the substrate not covered by the photoresist layer.

11. The method of claim 8, further comprising:
    forming a dielectric layer over the first and second interconnect structures and the thin film resistor;
    forming conductive vias through the dielectric layer to the first and second interconnect structures; and
    forming a third and a fourth interconnect structure coupled to the first and second interconnect structures, respectively, through the vias.

12. The method of claim 8, further comprising forming a dielectric cap over the thin film resistor.

13. The method of claim 8 wherein forming the resistive layer includes forming a first resistive layer over the substrate and forming a second resistor layer over the first resistor layer.

14. A method, comprising:
    forming first and second interconnect structures over a substrate of an integrated circuit die, each interconnect structure having a first conductor layer;
    forming a resistive layer over the substrate electrically connecting sidewalls of the first conductor layers of the first and second interconnect structures together;
    defining a thin film resistor between first and second interconnect structures by removing portions of the resistive layer;
    forming a dielectric layer over the first and second interconnect structures and the thin film resistor;
    forming conductive vias through the dielectric layer to the first and second interconnect structures; and
    forming a third and a fourth interconnect structure coupled to the first and second interconnect structures, respectively, through the vias.

15. The method of claim 14, further comprising forming a second conductor layer over the first conductor layer of the first and second interconnect structures.

16. The method of claim 14 wherein the resistive layer is less than 200 angstroms in thickness.

17. The method of claim 14 comprising forming a transistor below the substrate prior to forming the resistive layer.

18. The method of claim 17 wherein the first and second interconnect structures each include a first metal on a second metal, the resistive layer being in contact with the first metal and the second metal of the first and the second interconnect structures.

19. The method of claim 1 comprising:
    forming a dielectric layer over the first and second interconnects and the resistive layer;
    forming conductive vias through the dielectric layer to the first and second interconnects; and forming a third and a fourth interconnects coupled to the first and second interconnects, respectively, through the vias.

20. The method of claim 1, wherein forming a capped thin film resistor comprises:

forming a photoresist layer over portions of a top surface of the first and second interconnects and over a portion of the substrate between the first and second interconnects; and etching the resistive layer to expose the substrate not covered by the photoresist layer.

21. A method, comprising:

forming first and second interconnect structures over a substrate of an integrated circuit die, each interconnect structure having a first conductor layer;

forming a resistive layer over the substrate electrically connecting sidewalls of the first conductor layers of the first and second interconnect structures together;

defining a thin film resistor between first and second interconnect structures by removing portions of the resistive layer, the removing including:

forming a photoresist layer over portions of a top surface of the first and second interconnect structures and over a portion of the substrate between the first and second interconnect structures; and etching the resistive layer to expose the substrate not covered by the photoresist layer.

22. The method of claim 21, further comprising forming a second conductor layer over the first conductor layer of the first and second interconnect structures.

* * * * *

UNITED STATES PATENT AND TRADEMARK OFFICE
CERTIFICATE OF CORRECTION

PATENT NO. : 8,400,257 B2
APPLICATION NO. : 12/862599
DATED : March 19, 2013
INVENTOR(S) : Ting Fang Lim et al.

It is certified that error appears in the above-identified patent and that said Letters Patent is hereby corrected as shown below:

On the Title Page, Item (56):
"Hieber et al., "Structural and Electrical Properties of $CrSi_2$, Thin Film Resistors," *Thin Solid Films 36*: 357-360, 1976." should read, --Hieber et al., "Structural and Electrical Properties of $CrSi_2$ Thin Film Resistors," *Thin Solid Films 36*: 357-360, 1976.--.

Signed and Sealed this
Thirteenth Day of August, 2013

Teresa Stanek Rea
*Acting Director of the United States Patent and Trademark Office*